(12) United States Patent
Yanada et al.

(10) Patent No.: US 8,482,438 B2
(45) Date of Patent: Jul. 9, 2013

(54) DATA PROCESSING DEVICE AND DATA PROCESSING METHOD

(75) Inventors: Takashi Yanada, Tokyo (JP); Akira Ueno, Tokyo (JP); Masami Shimamura, Hanno (JP); Yoshinobu Tanaka, Tokyo (JP); Ryusuke Tsuchida, Tokyo (JP); Tomoyuki Sengoku, Tokyo (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 13/427,074

(22) Filed: Mar. 22, 2012

(65) Prior Publication Data

US 2012/0249345 A1  Oct. 4, 2012

(30) Foreign Application Priority Data

Mar. 24, 2011  (JP) ................................ P2011-066055

(51) Int. Cl.
*H03M 5/00*  (2006.01)
(52) U.S. Cl.
USPC .............................................. 341/58; 341/59
(58) Field of Classification Search
USPC ...................... 341/58, 59, 50; 348/845.2, 554, 348/571, 208.4, 208.12, 221.1, 231.3, 352; 382/237, 232; 710/100
See application file for complete search history.

(56) References Cited

U.S. PATENT DOCUMENTS 5,982,459 A  *  11/1999  Fandrianto et al. ........ 348/425.3

FOREIGN PATENT DOCUMENTS

JP  2007-312358 A  11/2007

* cited by examiner

*Primary Examiner* — Joseph Lauture
(74) *Attorney, Agent, or Firm* — Westerman, Hattori, Daniels & Adrian, LLP

(57) ABSTRACT

A data-processing device includes a plurality of data generation units, a plurality of bit change number calculation units, a bit change number comparison unit, a first data selection unit, and a bit-coupling unit. The data generation unit arranges input data to generate first conversion data based on each prescribed arranging method. The bit change number calculation unit compares values of respective bits in the first conversion data output at the n-th time and the (n+1)-th time by the corresponding data generation unit, and calculates a bit number based on the comparison result as a bit change number. The bit change number comparison unit compares values of the respective bit change numbers, selects the data generation unit, and outputs selection information. The first data selection unit outputs any one first conversion data selected based on the selection information as selection data. Then, the bit-coupling unit couples the selection information.

9 Claims, 24 Drawing Sheets

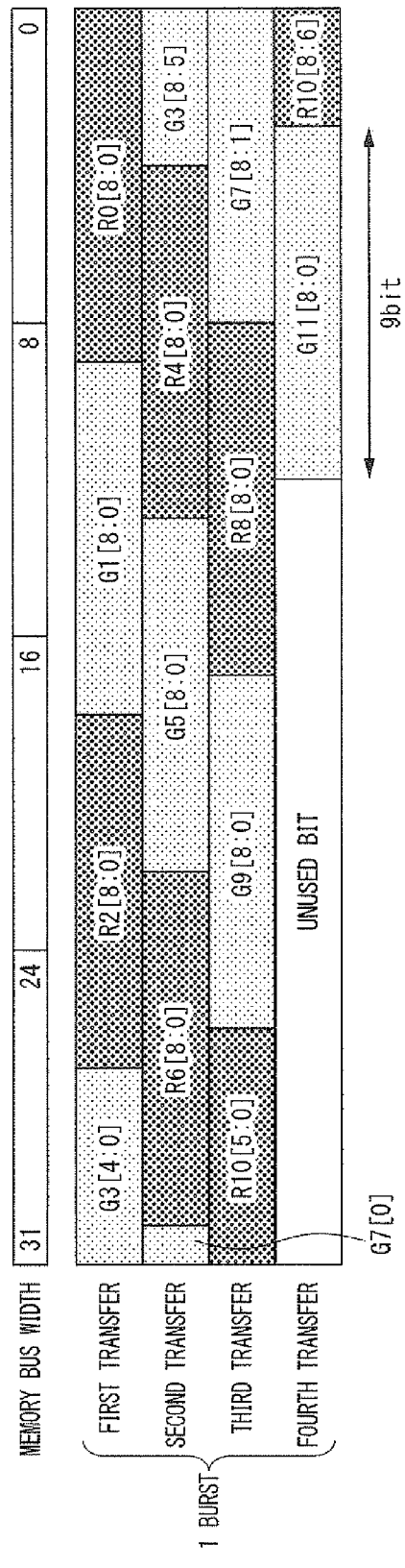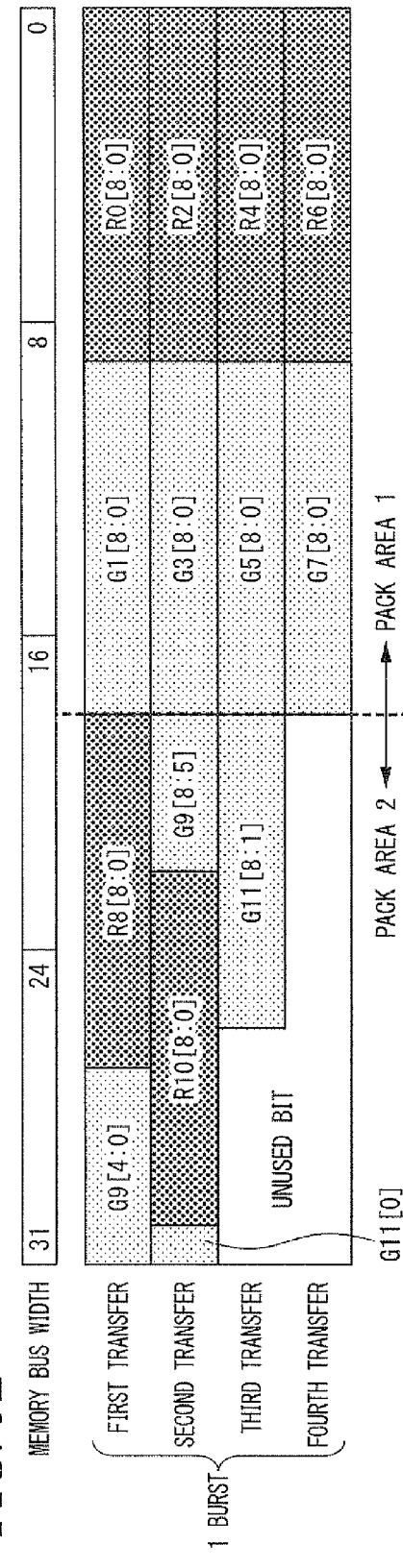

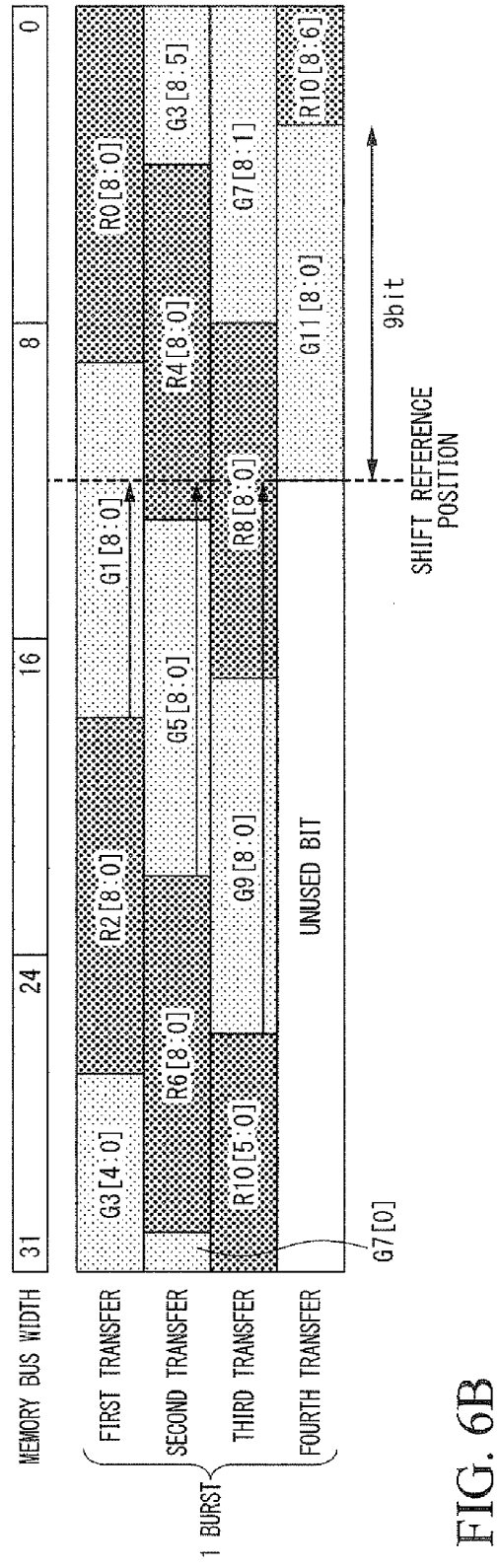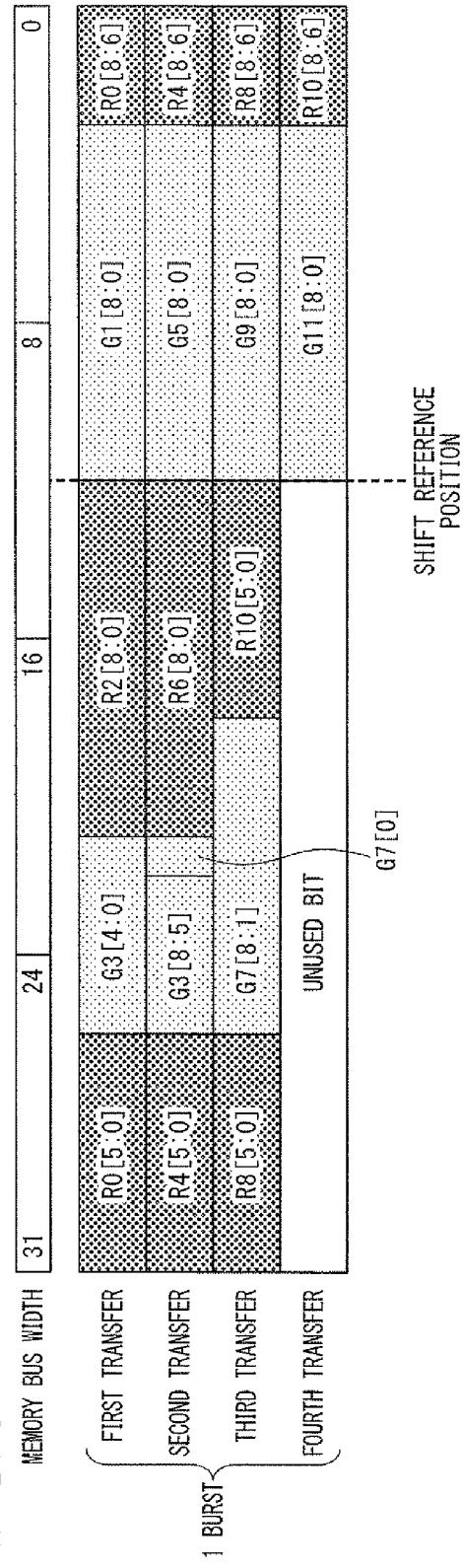

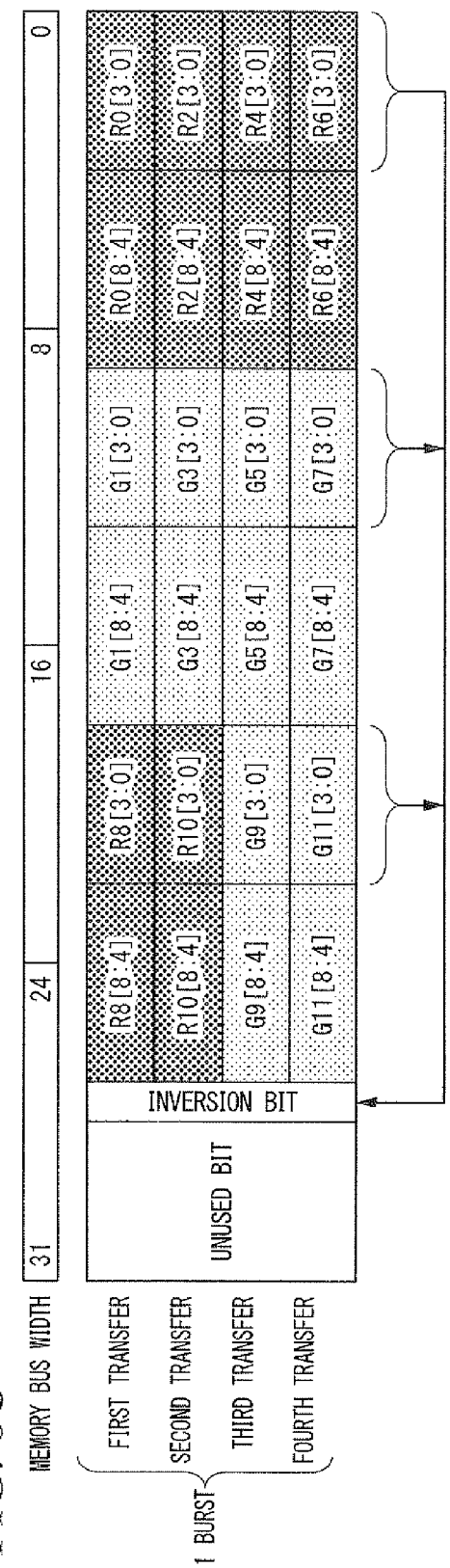

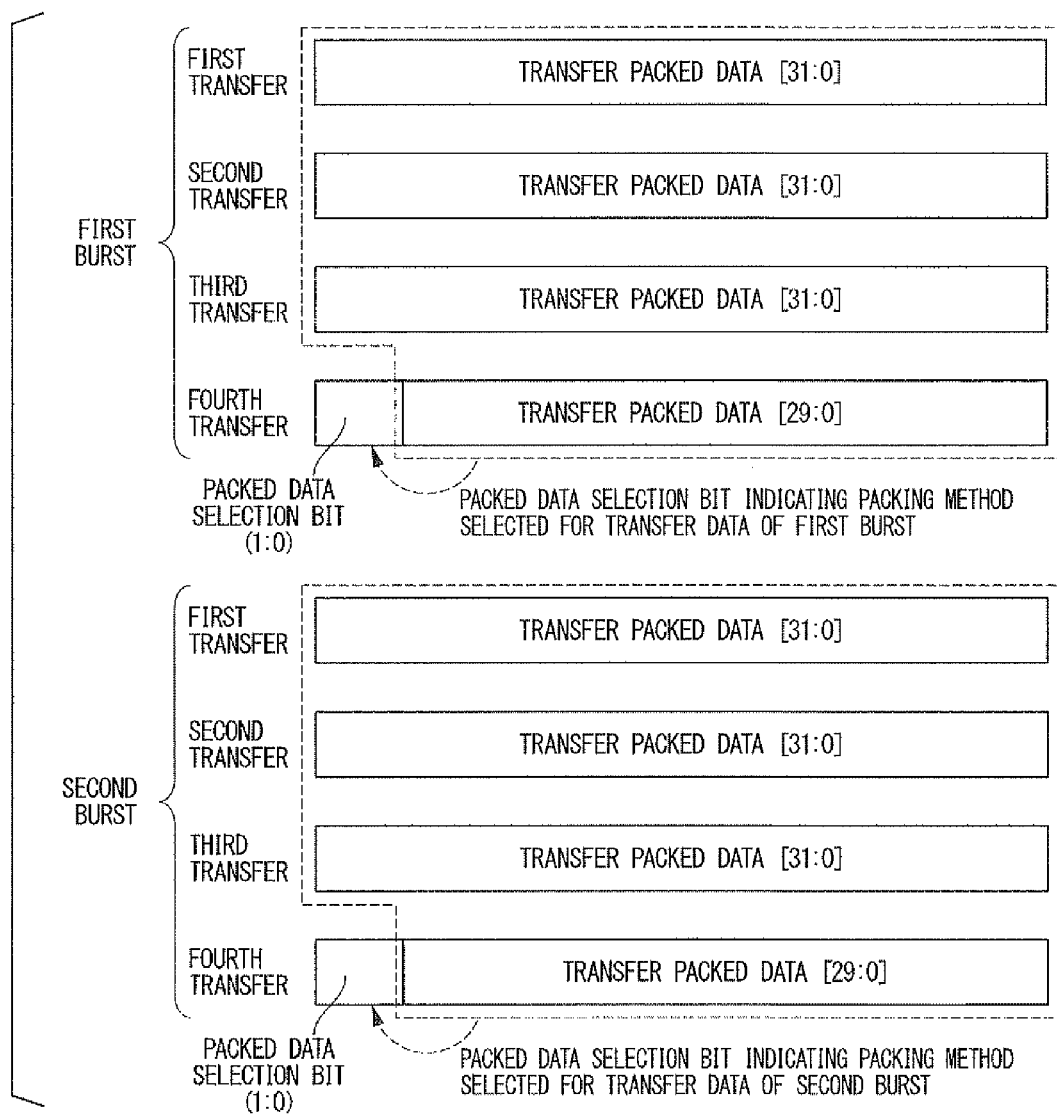

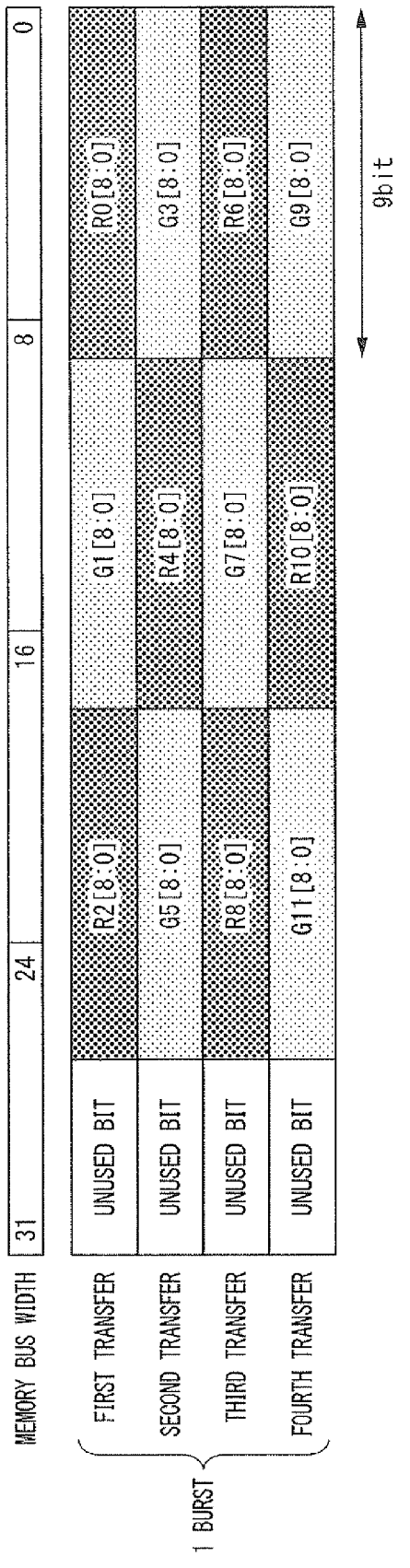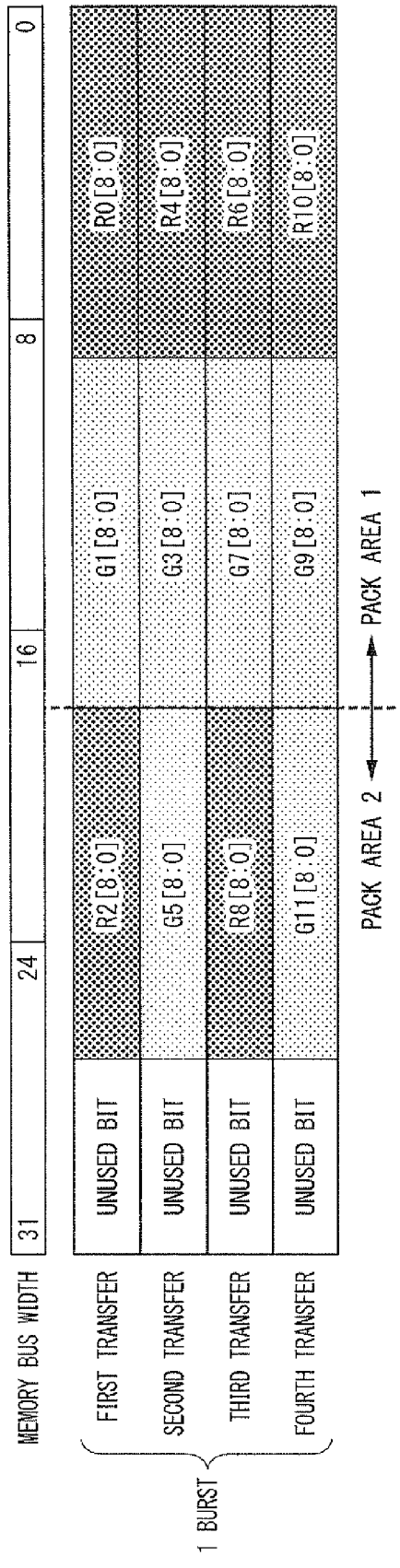

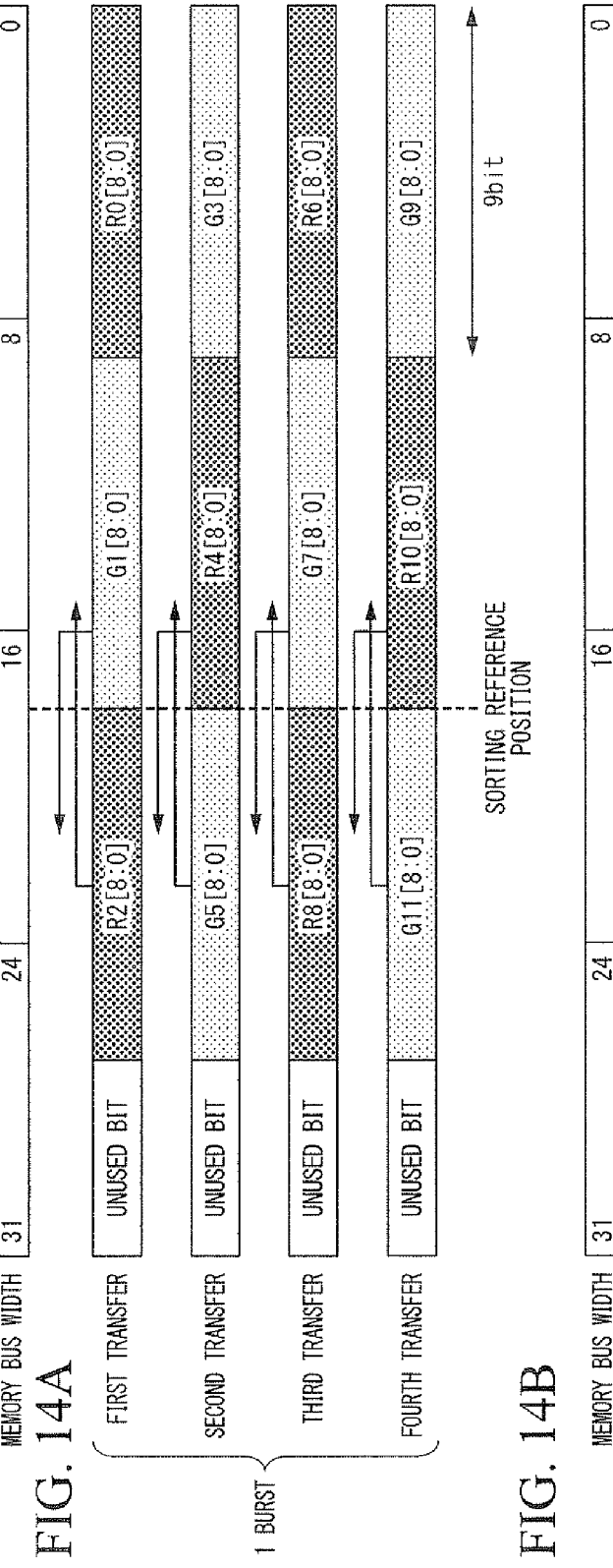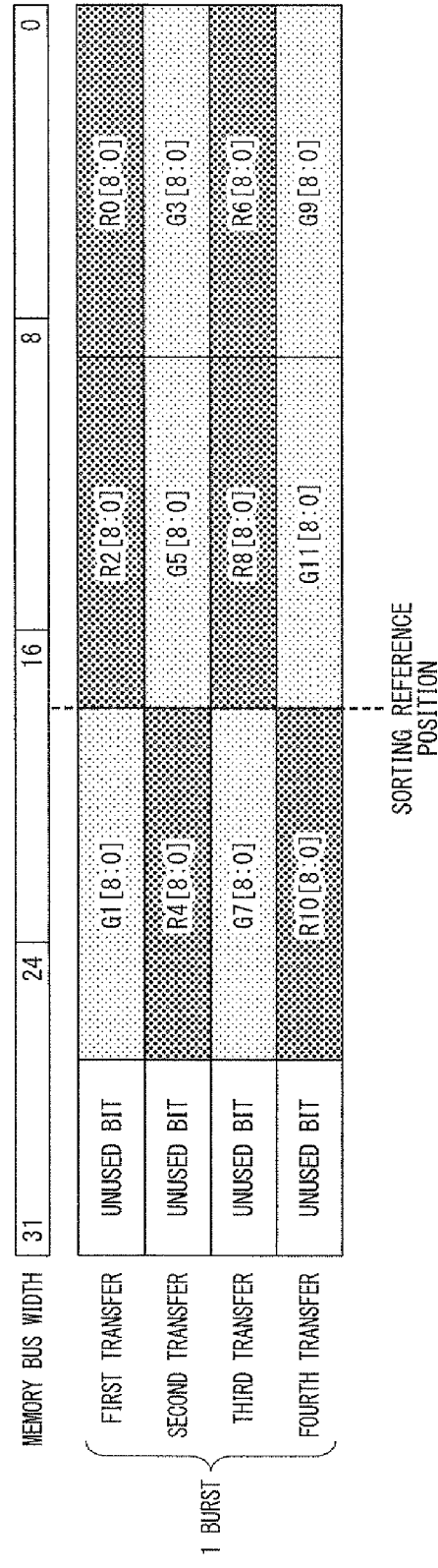

FIG. 20

| R0 | G1 | R2 | G3 | R4 | G5 | R6 | G7 | R8 | G9 | R10 | G11 | R12 | G13 | R14 | G15 |
| --- | --- | --- | --- | --- | --- | --- | --- | --- | --- | --- | --- | --- | --- | --- | --- |
| G16 | B17 | G18 | B19 | G20 | B21 | G22 | B23 | G24 | B25 | G26 | B27 | G28 | B29 | G30 | B31 |
| R32 | G33 | R34 | G35 | R36 | G37 | R38 | G39 | R40 | G41 | R42 | G43 | R44 | G45 | R46 | G47 |
| G48 | B49 | G50 | B51 | G52 | B53 | G54 | B55 | G56 | B57 | G58 | B59 | G60 | B61 | G62 | B63 |
| R64 | G65 | R66 | G67 | R68 | G69 | R70 | G71 | R72 | G73 | R74 | G75 | R76 | G77 | R78 | G79 |
| G80 | B81 | G82 | B83 | G84 | B85 | G86 | B87 | G88 | B89 | G90 | B91 | G92 | B93 | G94 | B95 |
| R96 | G97 | R98 | G99 | R100 | G101 | R102 | G103 | R104 | G105 | R106 | G107 | R108 | G109 | R110 | G111 |
| G112 | B113 | G114 | B115 | G116 | B117 | G118 | B119 | G120 | B121 | G122 | B123 | G124 | B125 | G126 | B127 |
| R128 | G129 | R130 | G131 | R132 | G133 | R134 | G135 | R136 | G137 | R138 | G139 | R140 | G141 | R142 | G143 |
| G144 | B145 | G146 | B147 | G148 | B149 | G150 | B151 | G152 | B153 | G154 | B155 | G156 | B157 | G158 | B159 |
| R160 | G161 | R162 | G163 | R164 | G165 | R166 | G167 | R168 | G169 | R170 | G171 | R172 | G173 | R174 | G175 |
| G176 | B177 | G178 | B179 | G180 | B181 | G182 | B183 | G184 | B185 | G186 | B187 | G188 | B189 | G190 | B191 |
| R192 | G193 | R194 | G195 | R196 | G197 | R198 | G199 | R200 | G201 | R202 | G203 | R204 | G205 | R206 | G207 |
| G208 | B209 | G210 | B211 | G212 | B213 | G214 | B215 | G216 | B217 | G218 | B219 | G220 | B221 | G222 | B223 |
| R224 | G225 | R226 | G227 | R228 | G229 | R230 | G231 | R232 | G233 | R234 | G235 | R236 | G237 | R238 | G239 |
| G240 | B241 | G242 | B243 | G244 | B245 | G246 | B247 | G248 | B249 | G250 | B251 | G252 | B253 | G254 | B255 |

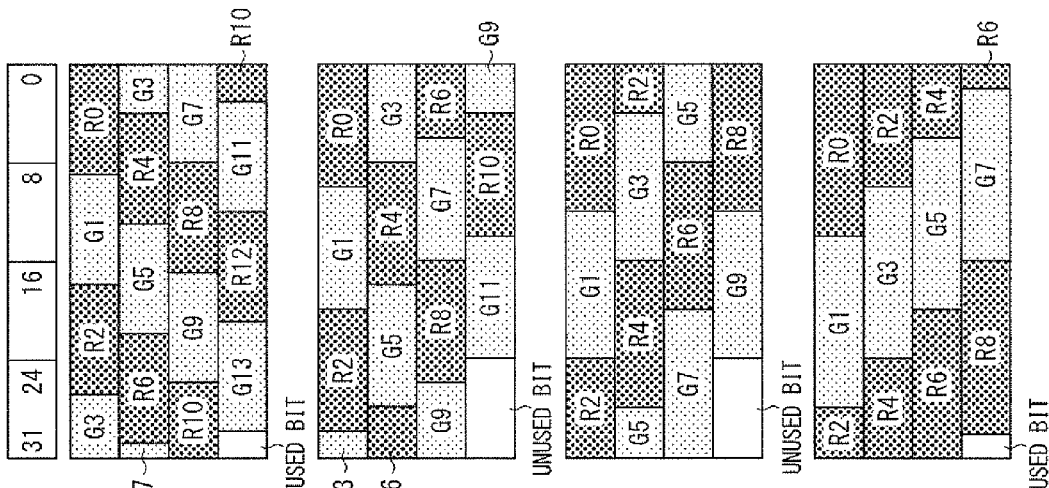
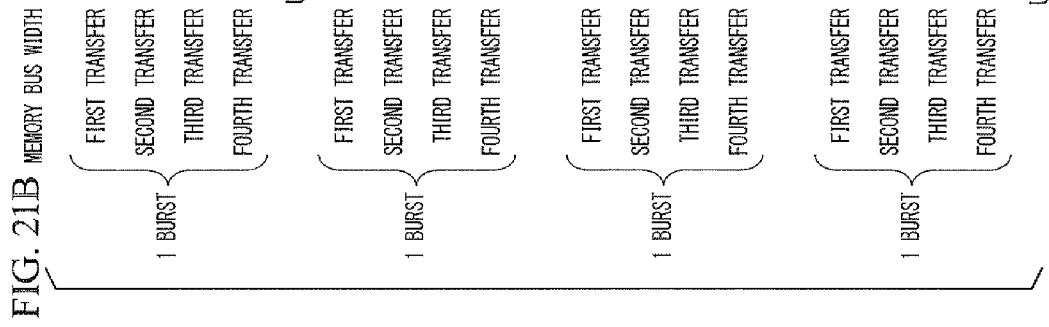
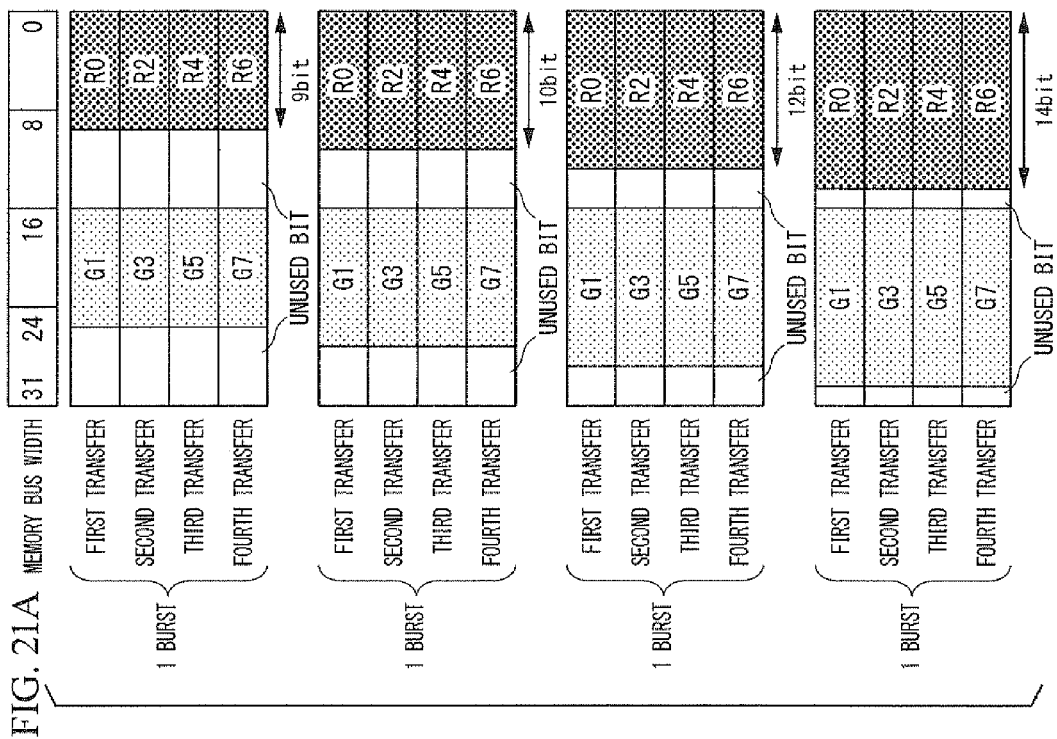
FIG. 21A
FIG. 21B

DATA PROCESSING DEVICE AND DATA PROCESSING METHOD

BACKGROUND

1. Field of the Invention

The present invention relates to a data-processing device and a data-processing method. This application claims priority from Japanese Patent Application No. 2011-066055, filed on Mar. 24, 2011, in the Japan Patent Office (JPO), the entire content of which is hereby incorporated by reference.

2. Description of the Related Art

An imaging apparatus, such as a still camera, a video camera, a medical endoscope camera, or an industrial endoscope camera, needs to process image data containing a large number of pixels (hereinafter referred to as "pixel data") with the recent increase of pixel numbers and speed of the imaging apparatus. In such an imaging apparatus, a memory for temporarily storing data is used when each processing block in the imaging apparatus processes image data obtained by photographing. Image data in each processing step is temporarily stored in the memory.

FIG. 19 is a block diagram showing a schematic configuration of a conventional imaging apparatus. For example, image data processing in a photographing operation of the imaging apparatus shown in FIG. 19 is performed in the following order.

(Step 1): First, an imaging-processing unit, for example, transmits image data obtained by a CCD (Charge-Coupled Device) solid-state imaging device to a memory via an output DMA (Direct Memory Access) unit to temporarily store the image data.

(Step 2): Subsequently, an image-processing unit reads the image data temporarily stored in the memory via an input DMA unit. The image-processing unit performs image processing for recording or display of the read image data. The image-processing unit then transmits the processed image data to the memory via the output DMA unit to temporarily store the image data.

(Step 3): Subsequently, a display-processing unit reads the image data subjected to image processing for display via an input DMA unit and causes a display device to display the image data.

Thus, in the imaging apparatus, the preceding processing block temporarily stores the image data in the memory. The subsequent processing block reads the image data stored in the memory and performs a next process. Thus, as respective processing blocks in the imaging apparatus perform delivery of the image data, which is a processing target, through the memory, processes of the imaging apparatus are sequentially performed.

In recent years, it has been preferable for an imaging apparatus such as a still camera, a video camera or the like to be able to be continuously used for a long time. Accordingly, there is a need for a technique for reducing power consumption of an electrical circuit of the imaging apparatus. One method of reducing the power consumption of the imaging apparatus includes a method of increasing a transfer rate for image data between each processing block (electrical circuit) and a memory. The increase of the transfer rate for image data, for example, may be realized by increasing a frequency of an operation clock of the imaging apparatus or shortening a transfer period of time of the image data between the processing block and the memory. These methods reduce power consumption due to transfer of the image data by increasing the transfer rate of the image data.

As a technique for shortening a transfer period of time of image data between the processing block and the memory, a packing technique as disclosed in Japanese Unexamined Patent Application, First Publication No. 2007-312358 is known. The packing technique disclosed in Japanese Patent Laid-Open Publication No. 2007-312358 is a technique of extending a bus width of a data bus used when each pixel data in the image data is transferred to a memory and arranging (packing) a plurality of adjacent pixel data in the data bus to transfer a plurality of pixel data at a time. Using this technique, the number of data transfers required to transfer all pixel data can be further reduced over conventional data transfer in which pixel data is transferred pixel by pixel, and the period of time for data transfer of the image data can be shortened. For example, when pixel data obtained from a 16×16 Bayer arrangement CCD is transferred to a memory as shown in FIG. 20, in the packing technique disclosed in Japanese Unexamined Patent Application, First Publication No. 2007-312358, pixel data for 4 pixels is one transfer unit to transfer the pixel at a time, thus reducing a transfer period of the image data to ¼. Accordingly, it is possible to reduce power consumption of an electrical circuit in the imaging apparatus, unlike a case in which pixel data is transferred to the memory pixel by pixel.

As a technique of further shortening the transfer period of image data, a packing method using burst transfer of DMA is considered. This is a method in which one burst, which is a unit for accessing memory at a prescribed certain number of cycles, is considered a unit packing pixel data. FIGS. 21A and 21B show an example of pixel data packing. FIG. 21A illustrates the packing method disclosed in Japanese Unexamined Patent Application, First Publication No. 2007-312358. An example in which the pixel data shown in FIG. 20 is packed is shown in FIG. 21A. FIG. 21B shows an example in which the pixel data shown in FIG. 20 is packed in a burst unit. An example in which a bus width (hereinafter referred to as "memory bus width") of a data bus used when the pixel data is transferred to the memory (hereinafter referred to as "memory bus") is 32 bits, and memory access for one cycle in burst transfer (hereinafter referred to as "one transfer") is performed four times, that is, one burst transfer is performed through four transfers, is shown in FIGS. 21A and 21B. An example in which resolution of pixel data of one pixel, that is, a bit number of the pixel data, is 9, 10, 12, and 14 from top to bottom, is shown in FIGS. 21A and 21B.

As can be seen from FIGS. 21A and 21B, in the packing method disclosed in Japanese Unexamined Patent Application, First Publication No. 2007-312358 shown in FIG. 21A, pixel data for two pixels per one transfer can be arranged on a memory bus, and pixel data for 8 pixels per one burst can be transferred to the memory. On the other hand, in the burst unit-based packing method shown in FIG. 21B, pixel data for 14, 12, 10, and 9 pixels can be transferred to the memory. In the packing method disclosed in Japanese Unexamined Patent Application, First Publication No. 2007-312358, since pixel data is arranged (packed) in the memory bus width, that is, in a unit of one transfer, a sum of bit numbers of a plurality of arranged pixel data must not exceed the memory bus width. Accordingly, in the packing method disclosed in Japanese Unexamined Patent Application, First Publication No. 2007-312358, there are many bits to which pixel data cannot be allocated (hereinafter referred to as "unused bits") within the memory bus width. On the other hand, in the burst unit-based packing method, since pixel data is arranged (packed) in units of bursts, even when a sum of bit numbers of a plurality of arranged pixel data exceeds the memory bus width, the pixel data can be arranged (packed) in a next transfer as long as the sum does not exceed one burst, as in FIG. 21B. That is, in the burst unit-based packing method, even when the memory bus width is not an integer times the resolution of pixel data, the pixel data can be arranged (mapped) over one transfer unit, which can reduce the number of unused bits. Accordingly, in the burst unit-based packing method, much pixel data can be transferred to the memory in the same time, that is, the transfer period of time of the image data can be shortened, and the power consumption of the electrical circuit in the imaging apparatus can be further reduced over the packing method disclosed in Japanese Unexamined Patent Application, First Publication No. 2007-312358.

In general, when data change (change (inversion) of data "0"→"1" or "1"→"0") is less, power consumption is known to be lower. Accordingly, reducing the power consumption of the imaging apparatus by reducing the data change on the memory bus between each processing block (electrical circuit) and a memory in the imaging apparatus is also considered. FIGS. 22A, 22B, 22C and 22D are diagrams illustrating a relationship between the data change on the data bus (memory bus) between the processing block and the memory in the imaging apparatus and the power consumption. FIG. 22A shows an example in which a bus width of a memory bus between the imaging-processing unit and the memory in the imaging apparatus shown in FIG. 19 is 32 bits. The data change on the memory bus is schematically shown in FIGS. 22B to 22D. In the example of FIGS. 22A to 22D, power consumption is lowest in the case of FIG. 22B in which there is no data change on the memory bus, and highest in the case of FIG. 22D in which there is the most data change on the memory bus.

From the above, if there is a great amount of change in pixel data between two continuous transfers (e.g., pixel data in first and second transfers of each burst transfer shown in FIG. 21B) in the burst transfer between each processing block and the memory in the imaging apparatus, power consumption due to the transfer of the image data increases. That is, the power consumption due to the transfer of the image data varies in proportion to the number of the same bits (bit number) on the memory bus that have changed between the two transfers.

In general, there is expected to be a small amount of change in data between adjacent pixels in image data, and bits whose values are being inverted are expected to be fewer than bits whose values are not being inverted when the same bits of pixel data of adjacent pixels are compared. Here, when the packing method disclosed in Japanese Unexamined Patent Application, First Publication No. 2007-312358, which is shown in FIG. 21A, and the burst unit-based packing method, which is shown in FIG. 21B, are compared with each other, the power consumption due to the transfer of the image data is lower in the packing method disclosed in Japanese Unexamined Patent Application, First Publication No. 2007-312358 in which the same bits are aligned in pixel data with the same colors, as shown in FIGS. 23A and 23B. Further, FIGS. 23A and 23B show a case in which the bit number of pixel data of one pixel is 9 in the packing method disclosed in Japanese Unexamined Patent Application, First Publication No. 2007-312358, which is shown in FIG. 21A, and the burst unit-based packing method shown in FIGS. 21B.

More specifically, in the packing method disclosed in Japanese Unexamined Patent Application, First Publication No. 2007-312358 shown in FIG. 23A, least significant bits of the memory bus shown in a range A are all the same bits (least significant bits) of pixel data with the same colors. On the other hand, in the burst unit-based packing method shown in FIG. 23B, least significant bits of the memory bus shown in a range B are all different bits of pixel data having different colors. It can be seen from this that, when locations of bits of pixel data arranged on the memory bus are made different between two continuous transfers by packing the image data in a burst unit, a change amount of the same bits on the memory bus becomes great and the power consumption due to the transfer of the image data increases.

That is, in the packing method disclosed in Japanese Unexamined Patent Application, First Publication No. 2007-312358 shown in FIG. 23A, the power consumption due to the transfer of the image data is low, but data transfer efficiency is low. In the burst unit-based packing method shown in FIG. 23B, the data transfer efficiency is good, but the power consumption due to the transfer of the image data is high.

Further, in the packing method disclosed in Japanese Unexamined Patent Application, First Publication No. 2007-312358, for example, pixel data of three pixels can be arranged (packed) in one transfer in which the pixel data is packed, as shown in FIG. 24. However, in this case, for example, least significant bits of the memory bus shown in a range C are the same bits (least significant bits) of the pixel data, but with different colors. The pixel data having different colors is highly likely to be greatly different in value, and even in the packing method disclosed in Japanese Unexamined Patent Application, First Publication No. 2007-312358, the power consumption due to the transfer of the image data may be not reduced by the pixel data arrangement in one transfer.

SUMMARY OF INVENTION

According to a first aspect of the present invention, a data-processing device includes a data conversion unit for, when converting a plurality of sequentially input data into transfer data of the same bit number as a data bus having a prescribed bit number and sequentially transferring the transfer data, arranging the input data in each transfer data in a conversion unit using one transfer data as one transfer unit and a prescribed number of transfer units as one conversion unit. The data conversion unit includes: a plurality of data generation units, a plurality of bit change number calculation units, a bit change number comparison unit, a first data selection unit, and a bit-coupling unit. The data generation unit arranges the input data in the data bus to generate first conversion data based on each prescribed arranging method. The bit change number calculation units correspond to the plurality of data generation units, respectively, and the bit change number calculation units compare a value of each bit in the first conversion data output at the n-th time (n is a natural number equal to or more than 1) by the data generation unit with a value of each bit in the first conversion data output at the (n+1)-th time by the data generation unit, and calculate a bit number based on the comparison result as a bit change number, for each first conversion data. The bit change number comparison unit compares values of the respective bit change numbers corresponding to the respective data generation units, selects the data generation unit having generated the first conversion data based on the comparison result, and outputs selection information indicating the selected data generation unit. The first data selection unit selects any one of the respective first conversion data output from the respective data generation units based on the selection information, and outputs the first selected conversion data as selection data. When the selection data is output as the transfer data, the bit-coupling unit couples the selection information in a position of a prescribed unused bit in the selection data in which the input data has not been arranged and outputs the selection information.

Preferably, the bit change number comparison unit selects the data generation unit having generated the first conversion data of which the value of the bit change number is smallest as a result of comparing values of the respective bit change numbers corresponding to the respective data generation units.

Preferably, each of the bit change number calculation units calculates the bit change number using the selection data selected by the first data selection unit as the first conversion data output at the (n+1)-th time by each data generation unit.

Preferably, the bit change number comparison unit collects and compares values of the respective bit change numbers corresponding to the respective data generation units in each conversion unit, and selects the data generation unit having generated the first conversion data in the conversion unit based on the comparison result, the first data selection unit selects any one of the respective first conversion data of the conversion unit output from the respective data generation units based on the selection information, and outputs the selected first conversion data of the conversion unit as selection data of the conversion unit, and when the selection data of the conversion unit is output as transfer data of the conversion unit, the bit-coupling unit couples the selection information in a position of a prescribed unused bit of the first conversion data containing unused bits in which the input data has not been arranged among the first conversion data contained in the selection data of the conversion unit to generate coupled data, and sequentially outputs any one of the first conversion data contained in the selection data of the conversion unit and the coupled data in each transfer unit.

Preferably, the bit change number comparison unit selects the data generation unit having generated the first conversion data in the conversion unit in which a collected value of the bit change number is smallest in all the first conversion data contained in the conversion unit as a result of collecting and comparing values of the respective bit change numbers corresponding to the respective data generation units, in each conversion unit.

According to a second aspect of the present invention, a data-processing device includes a data inverse-conversion unit for converting a plurality of input data into transfer data having the same bit number as a data bus having a prescribed bit number, and sequentially inversely converting transfer data sequentially transferred in each conversion unit using one transfer data as one transfer unit and a prescribed number of transfer units as one conversion unit to restore the plurality of original input data. The data inverse-conversion unit includes a bit division unit, a plurality of data-restoring units, and a second data selection unit. The bit division unit generates first conversion data. The first conversion data is data in which a data-processing device of a transfer source for the transfer data arranges the input data as the transfer data in the data bus based on respective prescribed arranging methods. The bit division unit compares a value of each bit in the first conversion data generated at the n-th time (n is a natural number equal to or more than 1) with a value of each bit in the first conversion data output at the (n+1)-th time, and calculates, for each first conversion data, a bit change number that is a bit number based on the comparison result. Also, the bit division unit receives, from the data bus, any one first conversion data selected from among the respective first generated conversion data based on a result of comparing values of the respective calculated bit change numbers, and selection information indicating that any first conversion data has been selected, as transfer data from the data-processing device of the transfer source for the transfer data, and divides the input transfer data into the selection information coupled in a position of a prescribed bit in the transfer data and the first conversion data. The data-restoring unit generates second conversion data so that a plurality of input data arranged in the first conversion data is restored to the original input data based on respective prescribed restoring methods corresponding to the respective prescribed arranging methods when the data-processing device of the transfer source for the transfer data generates the first conversion data. The second data selection unit selects any one of the respective second conversion data output from the respective data-restoring units based on the selection information, and outputs the selected second conversion data as the original input data.

Preferably, the bit division unit collects the input transfer data for each conversion unit, and divides the selection information coupled in a position of a prescribed bit in any of the transfer data of the conversion unit. The second data selection unit selects any one of the respective second conversion data of the conversion unit output from the respective data-restoring units based on the selection information, and sequentially outputs the second selected conversion data of the conversion unit as the original input data.

According to a third aspect of the present invention, a data-processing method includes a data conversion step of, when converting a plurality of sequentially input data into transfer data of the same bit number as a data bus having a prescribed bit number and sequentially transferring the transfer data, arranging the input data in each transfer data in a conversion unit using one transfer data as one transfer unit and a prescribed number of transfer units as one conversion unit. The data conversion step includes a plurality of data generation steps, a plurality of bit change number calculation steps, a bit change number comparison step, a first data selection step, and a bit-coupling step. The data generation step includes arranging the input data in the data bus to generate first conversion data based on each prescribed arranging method. The bit change number calculation steps correspond to the plurality of data generation steps, respectively, and the bit change number calculation steps include comparing a value of each bit in the first conversion data output at the n-th time (n is a natural number equal to or more than 1) in the data generation step with a value of each bit in the first conversion data output at the (n+1)-th time in the data generation step, and calculating a bit number based on the comparison result as a bit change number, for each first conversion data. The bit change number comparison step includes comparing values of the respective bit change numbers corresponding to the respective data generation step, selecting the data generation step in which the first conversion data has been generated based on the comparison result, and outputting selection information indicating the selected data generation step. The first data selection step includes selecting any one of the respective first conversion data output in the respective data generation steps based on the selection information, and outputting the first selected conversion data as selection data. The bit-coupling step includes, when the selection data is output as the transfer data, coupling the selection information in a position of a prescribed unused bit in the selection data in which the input data has not been arranged and outputting the selection information.

According to a fourth aspect of the present invention, a data-processing method includes a data inverse-conversion step of converting a plurality of input data into transfer data having the same bit number as a data bus having a prescribed bit number, and sequentially inversely converting transfer data sequentially transferred in each conversion unit using one transfer data as one transfer unit and a prescribed number of transfer units as one conversion unit to restore the plurality of original input data. The data inverse-conversion step includes a bit division step, a data-restoring step, and a second data selection step. In the bit division step, first conversion data is generated. The first conversion data is data in which a data-processing device of a transfer source for the transfer data arranges the input data as the transfer data in the data bus based on respective prescribed arranging methods. The bit division step includes comparing a value of each bit in the first conversion data generated at the n-th time (n is a natural number equal to or more than 1) with a value of each bit in the first conversion data output at the (n+1)-th time, and calculating, for each first conversion data, a bit change number that is a bit number based on the comparison result. The bit division step includes receiving, from the data bus, any one first conversion data selected from among the respective first generated conversion data based on a result of comparing values of the respective calculated bit change numbers, and selection information indicating that any first conversion data has been selected, as transfer data from the data-processing device of the transfer source for the transfer data, and dividing the input transfer data into the selection information coupled in a position of a prescribed bit in the transfer data and the first conversion data. The data-restoring step includes generating second conversion data so that a plurality of input data arranged in the first conversion data is restored to the original input data based on respective prescribed restoring methods corresponding to the respective prescribed arranging methods when the data-processing device of the transfer source for the transfer data generates the first conversion data. The second data selection step includes selecting any one of the respective second conversion data output in the respective data-restoring steps based on the selection information, and outputting the selected second conversion data as the original input data.

BRIEF DESCRIPTION OF DRAWINGS

FIG. 5A is a diagram illustrating another example of the data-arranging method in the packed data generation unit included in the data conversion unit of the first configuration;

FIG. 5B is a diagram illustrating another example of the data-arranging method in the packed data generation unit included in the data conversion unit of the first configuration;

FIG. 6A is a diagram illustrating still another example of the data-arranging method in the packed data generation unit included in the data conversion unit of the first configuration;

FIG. 6B is a diagram illustrating still another example of the data-arranging method in the packed data generation unit included in the data conversion unit of the first configuration;

FIG. 8A is a diagram illustrating still another example of the data-arranging method in the packed data generation unit included in the data conversion unit of the first configuration;

FIG. 8B is a diagram illustrating still another example of the data-arranging method in the packed data generation unit included in the data conversion unit of the first configuration;

FIG. 8C is a diagram illustrating still another example of the data-arranging method in the packed data generation unit included in the data conversion unit of the first configuration;

FIG. 9A is a diagram illustrating transfer data output from the data conversion unit of the first configuration;

FIG. 9B is a diagram illustrating transfer data output from the data conversion unit of the first configuration;

FIG. 13A is a diagram illustrating another example of the data-arranging method in the packed data generation unit included in the data conversion unit of the second configuration;

FIG. 13B is a diagram illustrating another example of the data-arranging method in the packed data generation unit included in the data conversion unit of the second configuration;

FIG. 14A is a diagram illustrating still another example of the data-arranging method in the packed data generation unit included in the data conversion unit of the second configuration;

FIG. 14B is a diagram illustrating still another example of the data-arranging method in the packed data generation unit included in the data conversion unit of the second configuration;

FIG. 20 is a diagram showing an example of an arrangement of image data;

FIG. 21A is a diagram showing an example of conventional data packing;

FIG. 21B is a diagram showing an example of conventional data packing;

DETAILED DESCRIPTION OF THE PRESENT INVENTION

Figure 1:
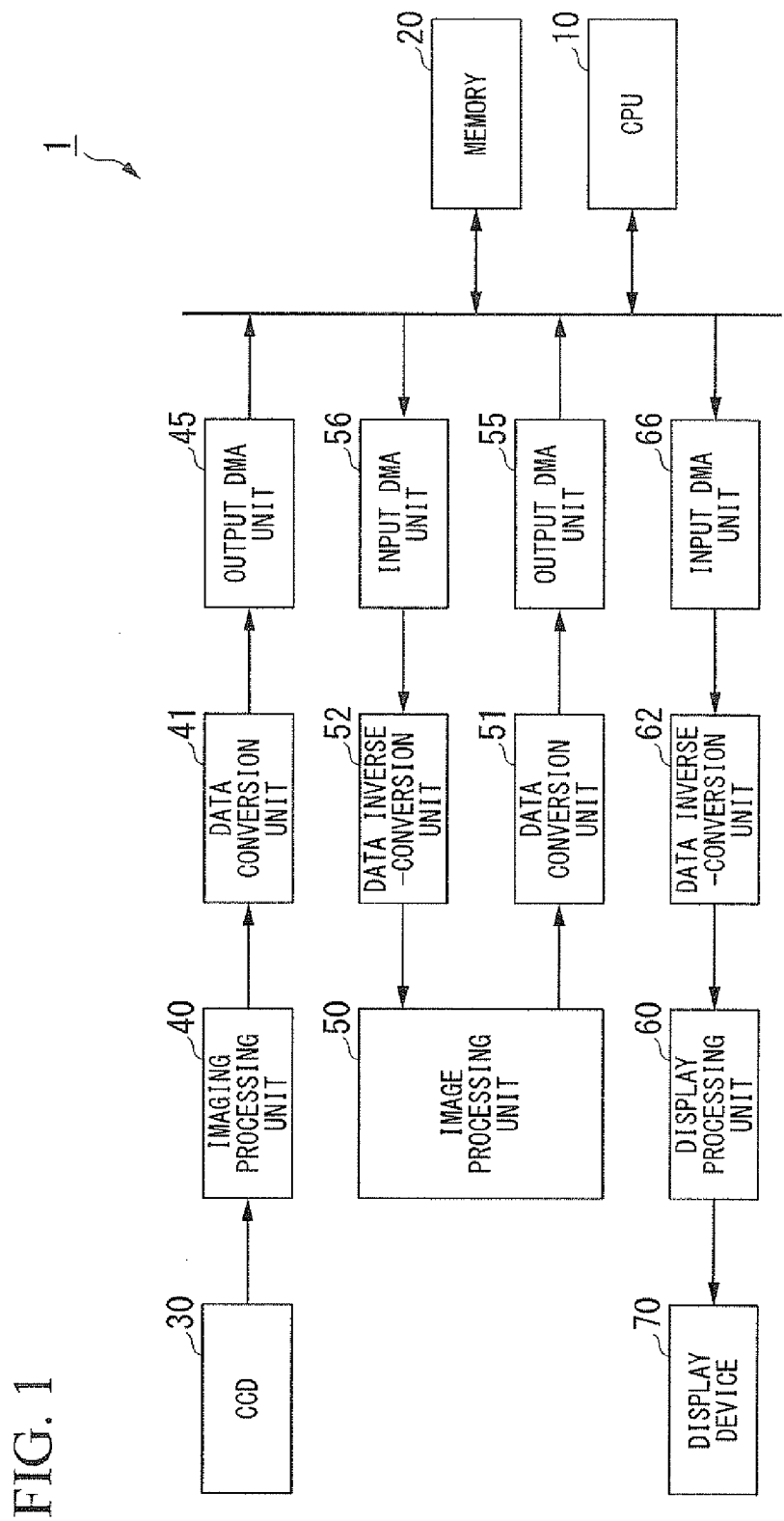
FIG. 1 is a block diagram showing a schematic configuration of an imaging apparatus in an embodiment of the present invention.

Hereinafter, an embodiment of the present invention will be described with reference to the accompanying drawings. FIG. 1 is a block diagram showing a schematic configuration of an imaging apparatus in the present embodiment. The imaging apparatus 1 shown in FIG. 1 includes a CPU 10, a memory 20, a CCD 30, an imaging-processing unit 40, an image-processing unit 50, a display-processing unit 60, a display device 70, data conversion units 41 and 51, data inverse-conversion units 52 and 62, output DMA units 45 and 55, and input DMA units 56 and 66. The imaging apparatus 1 has a function of recording image data obtained through photographing. However, for convenience of description, a case in which image data obtained through photographing is displayed will be described hereinafter. Only a connection of a memory bus that is a data bus associated with pixel data delivery between respective components (processing blocks) in the imaging apparatus 1 is shown in FIG. 1.

The CPU 10 is a control device that performs overall control of the imaging apparatus 1.

The memory 20, for example, is a memory such as a DRAM (Dynamic Random Access Memory) for temporarily storing pixel data processed by each processing block in the imaging apparatus 1. Pixel data in each processing step of each processing block in the imaging apparatus 1 is temporarily stored in the memory 20.

The CCD 30, for example, is a solid-state imaging device having a Bayer arrangement for converting incident subject light into an image signal. The CCD 30 outputs a pixel signal for the subject to the imaging-processing unit 40.

The imaging-processing unit 40 performs prescribed signal processing on the pixel signal input from the CCD 30 to generate image data.

The image-processing unit 50 performs various image processing in the imaging apparatus 1 on the image data generated by the imaging-processing unit 40 to generate image data.

The display-processing unit 60 converts the image data image-processed by the image-processing unit 50 into display data according to the display device 70. The display-processing unit 60 outputs the converted display data to the display device 70.

The display device 70, for example, is a display device such as a liquid crystal display for displaying the display data.

In the imaging apparatus 1 of the present embodiment, a pixel signal for a subject captured by the CCD 30 is processed by the imaging-processing unit 40, the image-processing unit 50, and then the display-processing unit 60, and displayed on the display device 70. In this case, the image data in each processing step is delivered between the respective processing blocks via the memory 20. The data conversion units 41 and 51, the data inverse-conversion units 52 and 62, the output DMA units 45 and 55, and the input DMA units 56 and 66 in the imaging apparatus 1 are processing blocks associated with delivery of the image data in each processing step.

The data conversion unit 41 or 51 arranges respective pixel data in the image data input from a preceding processing block (the imaging-processing unit 40 or the image-processing unit 50 in the present embodiment shown in FIG. 1) in respective bits of the memory bus using a prescribed arranging (packing) method. Configurations of the data conversion units 41 and 51 and a pixel data-packing method in the data conversion units 41 and 51 will be described in detail later.

The output DMA unit 45 or 55 writes (stores) the image data consisting of the pixel data packed in respective bits of the memory bus by the data conversion unit 41 or 51 to the memory 20 through DMA access.

The input DMA unit 56 or 66 reads the image data stored in the memory 20 through DMA access and outputs the read image data to the data inverse-conversion unit 52 or 62.

The data inverse-conversion unit 52 or 62 restores the pixel data contained in the image data input from the input DMA unit 56 or 66 to original image data using a method that is reverse to the prescribed arranging (packing) method and outputs the original image data to a subsequent processing block (the image-processing unit 50 or the display-processing unit 60 in the present embodiment shown in FIG. 1). Configurations of the data inverse-conversion units 52 and 62 will be described in detail later.

Here, image data processing in the imaging apparatus 1 shown in FIG. 1 will be described. In a photographing operation in the imaging apparatus 1, image data processing is performed in the following order.

(Step 1): First, the imaging-processing unit 40 performs prescribed signal processing on a pixel signal for a subject captured by the CCD 30 to generate image data (e.g., image data according to a pixel arrangement of the CCD 30). The imaging-processing unit 40 transfers the generated image data to the memory 20 via the data conversion unit 41 and the output DMA unit 45. The memory 20 temporarily stores the image data.

(Step 2): Subsequently, the image-processing unit 50 reads the image data temporarily stored in the memory 20 via the input DMA unit 56 and the data inverse-conversion unit 52. The image-processing unit 50 performs image processing for recording or display on the read image data to generate image data (e.g., RGB data, or YCbCr data having a YC422 dot sequential format). Then, the image-processing unit 50 transfers the generated image data to the memory 20 via the data conversion unit 51 and the output DMA unit 55 again. The memory 20 temporarily stores the image data.

(Step 3): Subsequently, the display-processing unit 60 reads the image data subjected to image processing for displaying by the image-processing unit 50 or image data for OSD (On-Screen Display) separately stored in the memory 20, via the input DMA unit 66 and the data inverse-conversion unit 62, and causes the display device 70 to display the image data.

When the imaging apparatus 1 records the image data obtained through photographing, a recording processing unit for performing an image data recording process, which is not shown, reads the image data subjected to image processing for recording by the image-processing unit 50 via an input DMA unit and a data inverse-conversion unit, which are not shown, and records the read image data for recording in an image data recording unit, such as a memory card, that is not shown. Further, when the imaging apparatus 1, for example, has a function of inputting/outputting sound, an audio processing unit for performing audio processing, which is not shown, stores audio data upon photographing in the memory 20 via a data conversion unit and an output DMA unit that are not shown. Further, the audio processing unit reads audio data stored in the memory 20 via an input DMA unit and a data inverse-conversion unit, which are not shown, and causes a sound output unit such as a speaker, which is not shown, to output sound according to the read audio data.

<First Configuration>

Next, the data conversion units in the imaging apparatus 1 will be described. As described above, the data conversion unit 41 and the data conversion unit 51 differ from each other only in preceding and subsequent processing blocks connected thereto. More specifically, as shown in FIG. 1, the data conversion unit 41 is arranged between the preceding imaging-processing unit 40 and the subsequent output DMA unit 45. The data conversion unit 51 is arranged between the preceding image-processing unit 50 and the subsequent output DMA unit 55. Accordingly, the data conversion unit 41 and the data conversion unit 51 differ from each other only in data formats of input image data and output image data. Hereinafter, the data conversion unit 41 will be described as representative.

Figure 2:
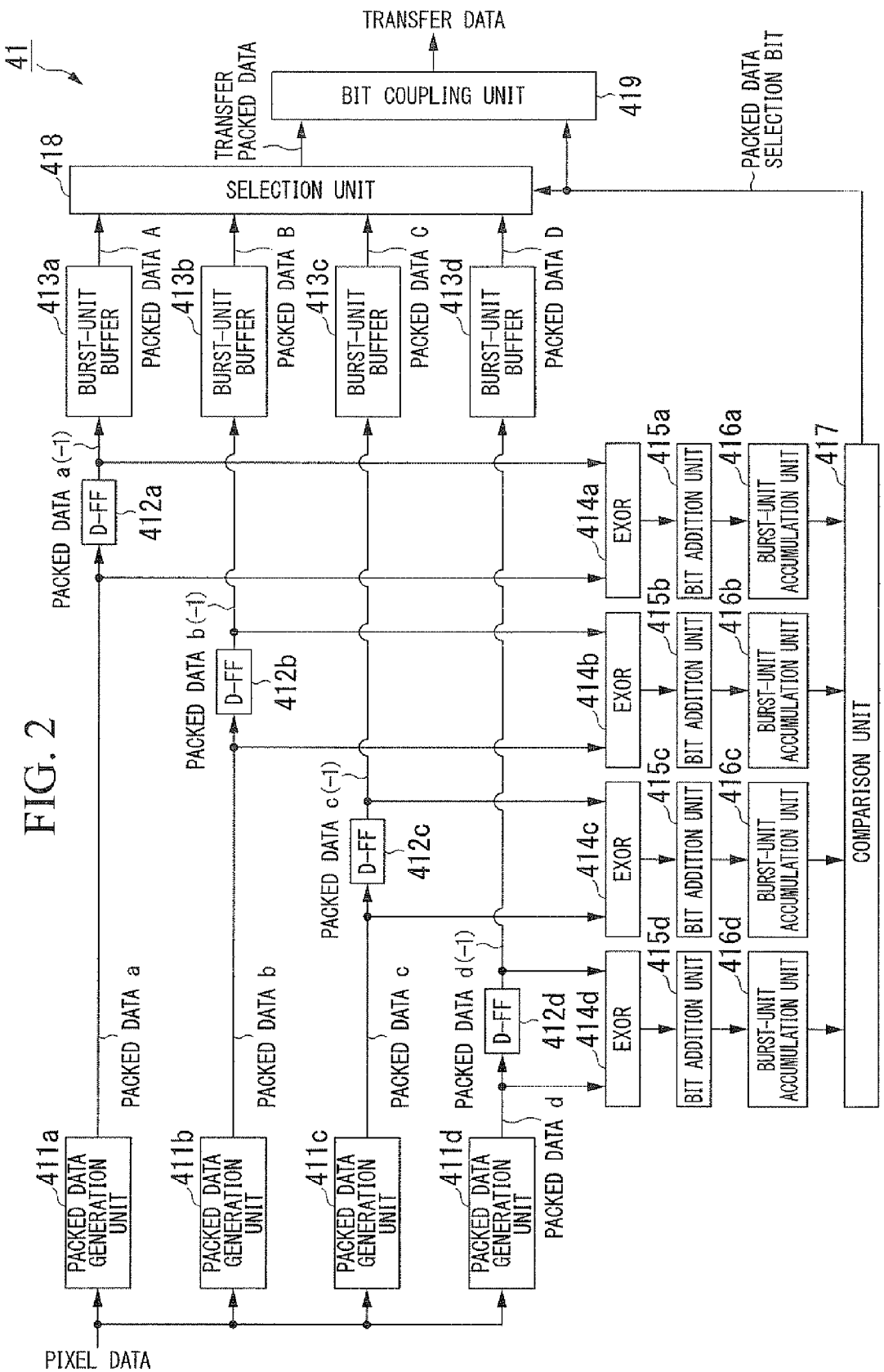
FIG. 2 is a block diagram showing a schematic configuration of a data conversion unit of a first configuration included in the imaging apparatus of the present embodiment.

FIG. 2 is a block diagram showing a schematic configuration of the data conversion unit 41 of the first configuration included in the imaging apparatus 1 of the present embodiment. As shown in FIG. 2, the data conversion unit 41 includes four packed data generation units 411a to 411d, four D-FFs 412a to 412d, four burst-unit buffers 413a to 413d, four EXOR (exclusive OR) circuits 414a to 414d, four bit addition units 415a to 415d, four burst-unit accumulation units 416a to 416d, a comparison unit 417, a selection unit 418, and a bit-coupling unit 419. Hereinafter, "any one" of the packed data generation units 411a to 411d, the D-FFs 412a to 412d, the burst-unit buffers 413a to 413d, the EXOR circuits 414a to 414d, the bit addition units 415a to 415d, or the burst-unit accumulation units 416a to 416d is represented as follows:

Any one of the packed data generation units 411a to 411d: "packed data generation unit 411"

Any one of the D-FFs 412a to 412d: "D-FF 412"

Any one of the burst-unit buffers 413a to 413d: "burst-unit buffer 413"

Any one of the EXOR circuits 414a to 414d: "EXOR circuit 414"

Any one of the bit addition units 415a to 415d: "bit addition unit 415"

Any one of the burst-unit accumulation units 416a to 416d: "burst-unit accumulation unit 416"

Hereinafter, the following case will be described. That is, image data of a 16×16 Bayer arrangement (hereinafter referred to as "Bayer data") as shown in FIG. 20 is input to the data conversion unit 41. Pixel data in the input Bayer data is arranged (packed) in a memory bus using a prescribed packing method to generate transfer data, which is then output. Further, a bit number of each pixel data in the Bayer data is 9 bits and a bus width of the memory bus (memory bus width) is 32 bits. The data conversion unit 41 outputs 32-bit transfer data packed using four transfers as a unit of packing pixel data in the Bayer data and the four transfers as a unit of one burst transfer, that is, using one burst as a pixel data-packing unit. Also, in the Bayer data shown in FIG. 20, numbers of the pixel data represent positions of a pixel in the CCD 30, and "R," "G," and "B" before the numbers represent colors of the pixel in the CCD 30. More specifically, "R" represents pixel data of a red pixel of the CCD 30, "G" represents pixel data of a green pixel of the CCD 30, and "B" represents pixel data of a blue pixel of the CCD 30.

The data conversion unit 41 arranges data of each bit of 9-bit pixel data sequentially input from the imaging-processing unit 40, in each bit of a memory bus to generate 32-bit transfer data using any one of prescribed packing methods, which will be described. The data conversion unit 41, for example, sequentially outputs the generated transfer data based on a data enable signal input from the output DMA unit 45. The data enable signal is a signal that contains information indicating transfer data of which transfer is transferred when the output DMA unit 45 performs the burst transfer.

When the data conversion unit 41 generates transfer data, the data conversion unit 41 first packs the input pixel data using a plurality of prescribed packing methods to generate a plurality of packed data. Also, the data conversion unit 41 selects the packed data of which the bit change on the memory bus is smallest in one burst transfer (hereinafter referred to as "transfer packed data") among the generated packed data. Thereafter, the data conversion unit 41 adds information when the packed data is selected (packed data selection bit), in an unused bit present in the transfer packed data, that is, the packing unit (four transfers), and outputs the transfer packed data as transfer data to be finally output.

Each of the packed data generation units 411a to 411d arranges data of each bit of the input pixel data in each bit of the data bus corresponding to the memory bus to generate packed data of one burst, that is, the packing unit (four transfers), using a prescribed packing method. Since this data bus corresponds to the respective bits of the memory bus, it will be hereinafter described as "memory bus." The packed data generation units 411a to 411d sequentially output the generated packed data of each transfer, that is, a bit number of the memory bus width (32 bits in the data conversion unit 41 of the first configuration), to the corresponding D-FFs 412a to 412d and the corresponding EXOR circuits 414a to 414d.

In the following description, packed data of one burst generated by the packed data generation units 411a to 411d is referred to as packed data A to D, respectively. Also, in the following description, the packed data of each transfer of the packed data A to D output by the respective packed data generation units 411a to 411d is referred to as packed data a to d. Further, examples of a packing method in the packed data generation unit 411 and the packed data will be described in detail later.

The D-FFs 412a to 412d hold the 32-bit packed data a to d output from the corresponding packed data generation units 411a to 411d, respectively. The packed data a to d held by the D-FF 412 is packed data a to d output by the packed data generation unit 411 in one previous transfer and output to the corresponding burst-unit buffers 413a to 413d and the corresponding EXOR circuits 414a to 414d. Hereinafter, the packed data a to d of one previous transfer is referred to as "packed data a(−1) to d(−1)."

The burst-unit buffers 413a to 413d hold the 32-bit packed data a(−1) to d(−1) input from the corresponding D-FFs 412 by the packed data of one burst, that is, the packing unit (four transfers), respectively. As the respective burst-unit buffers 413 hold the packed data a to d input via the corresponding D-FFs 412 by the packed data of the packing unit (four transfers), the packed data A to D generated by the respective packed data generation units 411 is held in the burst-unit buffer 413. The burst-unit buffers 413a to 413d sequentially output, for example, the held packed data A to D for each transfer, that is, the packed data a to d to the selection unit 418, based on an output request signal, which is not shown, input from the selection unit 418. Further, the output request signal is a signal for sequentially reading the 32-bit packed data a to d held in the burst-unit buffer 413 selected by the selection unit 418. Accordingly, the output request signal is output to any one burst-unit buffer 413 of the burst-unit buffers 413a to 413d selected by the selection unit 418.

The EXOR circuits 414a to 414d compare values of the respective bits of two packed data of the 32-bit packed data a to d output from the corresponding packed data generation units 411a to 411d and the 32-bit packed data a(−1) to d(−1) output from the corresponding D-FFs 412a to 412d to detect whether there are bits whose value has been changed.

Also, each of the EXOR circuits 414a to 414d outputs a value ("1") indicating that there is a bit whose value has been changed, or a value ("0") indicating that there is no bit whose value has been changed, for every compared bit.

Further, the EXOR circuits 414a to 414d compare values of the bits, in which the packed data a(−1) to d(−1) input from the D-FFs 412 is previous packed data a to d output from the packed data generation units 411a to 411d in the same packing unit (four transfers). That is, the EXOR circuits 414a to 414d compare the previous packed data a to d output by the packed data generation units 411a to 411d with current packed data a to d, for each bit.

More specifically, exclusive OR of the bits of the packed data a to d output from the packed data generation units 411 and the bits of the packed data a(−1) to d(−1) output from the D-FFs 412 is taken in the comparison between the two packed data in the respective EXOR circuits 414. Accordingly, when the value of the bit of current packed data a to d output from the packed data generation units 411 is equal to the value of the bit of previous packed data a to d (packed data a(−1) to d(−1)) output from the packed data generation units 411, "0" is output. Further, when the value of the bit of the current packed data a to d output from the packed data generation units 411 differs from the value of the bit of the previous packed data a to d (packed data a(−1) to d(−1)) output from the packed data generation units 411, "1" is output.

Further, when the current packed data a to d output from the packed data generation units 411 is packed data a to d of the first transfer, a value ("0") indicating that the values of the bits have not been changed is output for all bits.

The bit addition units 415a to 415d count the number of bits whose values have been changed, which are input from the corresponding EXOR circuits 414a to 414d, and calculate a sum (hereinafter referred to as "bit change number") of the numbers of bits the values of which have been changed. Also, the bit addition units 415a to 415d output the calculated bit change numbers to the corresponding burst-unit accumulation unit 416a to 416d. For example, in order to facilitate explanation, a case in which the respective packed data compared by the EXOR circuit 414a is assumed to be 8 bits is considered. When the value of the bit whose value has been changed, which is input from the EXOR circuit 414a, is "1111_0000," the bit addition unit 415a outputs "4" as the value of the bit change number. Thus, when values of the previous packed data a to d (packed data a(−1) to d(−1) output from D-FF 412) output by the packed data generation units 411a to 411d are changed into values of the current packed data a to d next output by the packed data generation units 411a to 411d, the respective bit addition units 415a to 415d output the number (bit change number) of bits whose value on the memory bus has been changed to the other value bit.

The burst-unit accumulation units 416a to 416d accumulate the bit change numbers input from the corresponding bit addition units 415a to 415d, of one burst, that is, the packing unit (four transfers), respectively. Accordingly, a total change number of bits on the memory bus due to the packed data output by the respective packed data generation units 411a to 411d is calculated in one burst transfer. The respective burst-unit accumulation units 416a to 416d output the accumulated bit change numbers to the comparison unit 417.

The comparison unit 417 determines the burst-unit accumulation unit 416 outputting the smallest bit change number among the accumulated bit change numbers input from the respective burst-unit accumulation units 416a to 416d, and specifies (selects) the burst-unit accumulation unit 416 outputting the smallest bit change number. Also, the comparison unit 417 outputs information indicating the burst-unit accumulation unit 416 outputting the smallest bit change number, that is, information indicating a packing method in which a bit change on the memory bus is smallest, to the selection unit 418 and the bit-coupling unit 419 as the packed data selection bit. Accordingly, the packed data of which the bit change on the memory bus is smallest in one burst transfer is selected.

Further, values of the packed data selection bit corresponding to the respective packed data generation units 411 included in the data conversion unit 41 are determined in advance. Also, the same values as those in the data conversion unit 41 are determined in the data inverse-conversion unit 52 corresponding to the data conversion unit 41 in advance. This enables the data inverse-conversion unit 52 to determine the packing method selected in the data conversion unit 41.

The selection unit 418 selects any one burst-unit buffer 413 of the burst-unit buffers 413a to 413d according to the packed data selection bit input from the comparison unit 417. Also, for example, the selection unit 418 outputs an output request signal, which is not shown, to the selected burst-unit buffer 413, and outputs the packed data (any one of the packed data A to D) input from the selected burst-unit buffer 413 to the bit-coupling unit 419 as transfer packed data. Further, the output request signal is a signal for sequentially reading the 32-bit packed data held in the selected burst-unit buffer 413, as described above. Accordingly, the selection unit 418 outputs the output request signal only to any one burst-unit buffer 413 of the selected burst-unit buffers 413a to 413d.

The bit-coupling unit 419 adds the packed data selection bit input from the comparison unit 417, in unused bits present in the transfer packed data input from the selection unit 418, that is, the packing unit (four transfers). Also, the bit-coupling unit 419 outputs the transfer packed data having the packed data selection bit added thereto, to the output DMA unit 45 as transfer data finally output by the data conversion unit 41.

Further, as a position of the unused bit in the transfer packed data in which the bit-coupling unit 419 adds the packed data selection bit, a fixed position of an unused bit common to all the packed data A to D of the packing unit (four transfers) generated by the packed data generation units 411a to 411d is determined in advance. Further, the same position as the fixed position of the unused bit common to the packed data A to D is also determined in advance as the position of the unused bit in which the packed data selection bit has been added in the data inverse-conversion unit 52 corresponding to the data conversion unit 41. This enables the data inverse-conversion unit 52 to inversely convert the transfer data output by the data conversion unit 41 based on the packed data selection bit added in the fixed position, to thereby restore the original pixel data.

Next, the data inverse-conversion unit in the imaging apparatus 1 will be described. Further, the data inverse-conversion unit 52 and the data inverse-conversion unit 62 differ only in a preceding processing block and a subsequent processing block connected thereto, as described above. More specifically, the data inverse-conversion unit 52 is arranged between the preceding input DMA unit 56 and the subsequent image-processing unit 50, as shown in FIG. 1. The data inverse-conversion unit 62 is arranged between the preceding input DMA unit 66 and the subsequent display-processing unit 60. Accordingly, the data inverse-conversion unit 52 and the data inverse-conversion unit 62 differ only in data formats of input image data and output image data. Hereinafter, the data inverse-conversion unit 52 will be described as representative.

Figure 3:
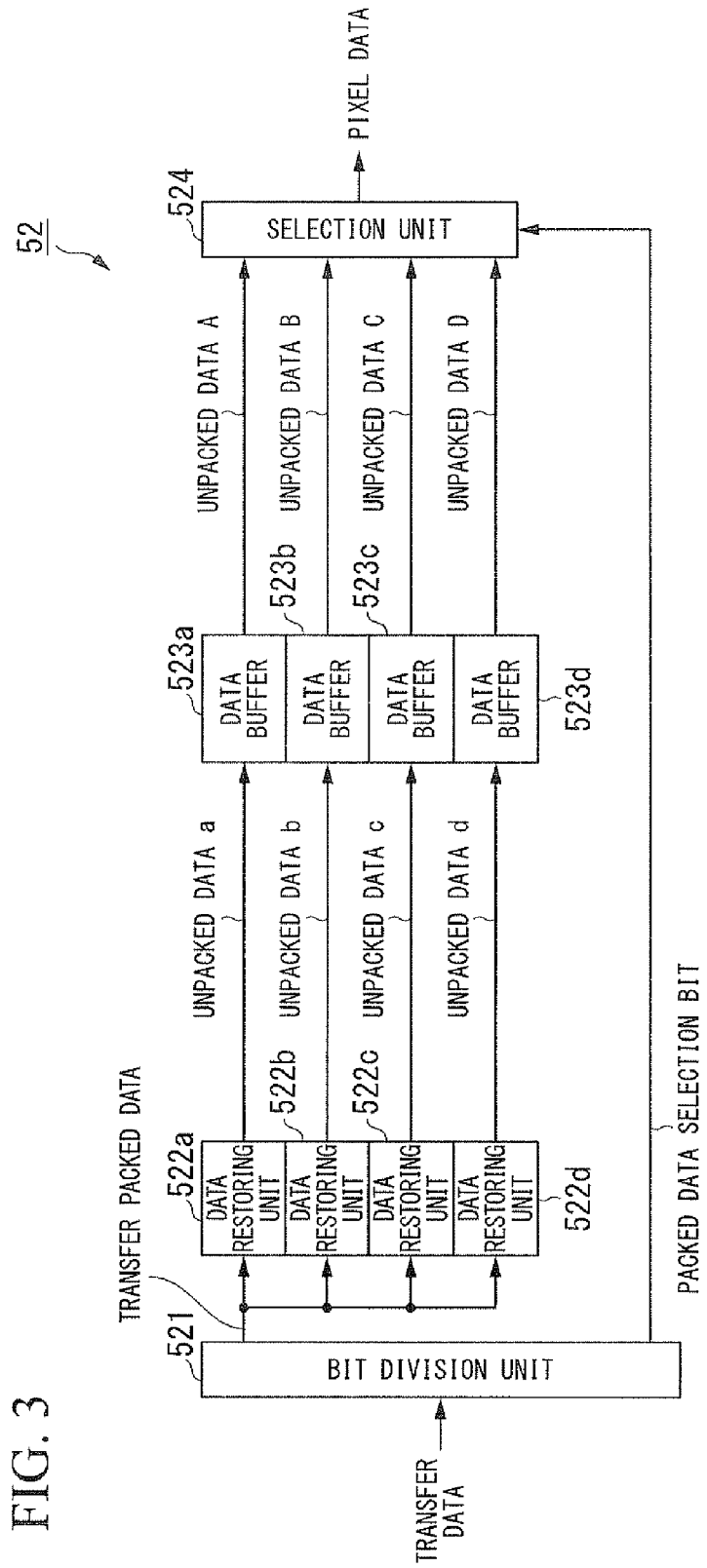
FIG. 3 is a block diagram showing a schematic configuration of a data inverse-conversion unit of the first configuration included in the imaging apparatus of the present embodiment.

FIG. 3 is a block diagram showing a schematic configuration of the data inverse-conversion unit 52 of the first configuration included in the imaging apparatus 1 of the present embodiment. As shown in FIG. 3, the data inverse-conversion unit 52 includes a bit division unit 521, four data-restoring units 522a to 522d, four data buffers 523a to 523d, and a selection unit 524. Hereinafter, "any one" of the data-restoring units 522a to 522d, or the data buffers 523a to 523d is represented as follows:

Any one of the data-restoring units 522a to 522d: "data-restoring unit 522"

Any one of the data buffers 523a to 523d: "data buffer 523"

Hereinafter, a case in which the transfer data of one burst using four transfers as a packing unit, which has been packed by the data conversion unit 41, is input to the data inverse-conversion unit 52 via the input DMA unit 56 and restored to the Bayer data shown in FIG. 20 will be described. Accordingly, the description will be given on the assumption that a bit number of each pixel data in the Bayer data is 9, and the memory bus width is 32 bits.

The data inverse-conversion unit 52 restores the data arranged in each bit of the 32-bit transfer data input from the input DMA unit 56 to the original image data (Bayer data) to be image-processed by the image-processing unit 50 to restore 9-bit pixel data using a method that is reverse to any one of prescribed packing methods, which will be described later. The data inverse-conversion unit 52 sequentially outputs, for example, the restored original pixel data based on a data enable signal, which is not shown, input from the image-processing unit 50. Further, the data enable signal is a signal indicating a timing of outputting to the image-processing unit 50.

Further, the same fixed position as the position of the unused bit in which the packed data selection bit has been added by the data conversion unit 41 has been determined in the data inverse-conversion unit 52 in advance, as described above. Also, when the data inverse-conversion unit 52 restores pixel data, the data inverse-conversion unit 52 first divides the input 32-bit transfer data into the packed data selection bit, and the packed data obtained by the packed data generation unit 411 in the data conversion unit 41 packing the pixel data. Further, the above-described transfer data is the same as the transfer data generated by the data conversion unit 41. Further, since the above-described packed data is the same as the transfer packed data selected by the selection unit 418 in the data conversion unit 41, it will be hereinafter described as "transfer packed data." The data inverse-conversion unit 52 sequentially divides (unpacks) the transfer packed data using a method that is reverse to the packing method in the data conversion unit 41 to generate data corresponding to the pixel data (hereinafter referred to as "unpacked data"). Thereafter, the data inverse-conversion unit 52 selects the same unpacked data as the pixel data input to the data conversion unit 41 from among the unpacked data based on the packed data selection bit, and outputs the selected unpacked data as original pixel data.

The bit division unit 521 divides the transfer data input from the input DMA unit 56 into the packed data selection bit added in the prescribed fixed position in the transfer data and the transfer packed data. The bit division unit 521 outputs the divided transfer packed data to the data-restoring unit 522. Also, the bit division unit 521 outputs the divided packed data selection bit to the selection unit 524. Also, the bit division unit 521 directly outputs the transfer data in which the packed data selection bit has not been added, to the data-restoring unit 522 as the transfer packed data.

The data-restoring units 522a to 522d correspond to the packed data generation units 411a to 411d, respectively. The data-restoring units 522a to 522d sequentially divide (unpack) the transfer packed data input from the bit division unit 521 into the respective data arranged in the respective bits of the transfer packed data (9-bit data in the data inverse-conversion unit 52 of the first configuration) to generate unpacked data of one burst, that is, the packing unit (four transfers), using a method that is reverse to the prescribed packing method. Also, the respective data-restoring units 522a to 522d sequentially output the generated unpacked data to the corresponding data buffer 523a to 523d, for each pixel, that is, a bit number of the pixel data (9 bits in the data inverse-conversion unit 52 of the first configuration).

In the following description, the unpacked data for each pixel output by the respective data-restoring units 522a to 522d is referred to as unpacked data a to d, respectively. Also, in the following description, the unpacked data of one burst generated by the respective data-restoring units 522a to 522d is referred to as unpacked data A to D, respectively.

The data buffers 523a to 523d hold the 9-bit unpacked data a to d input from the corresponding data-restoring units 522 by unpacked data of one burst, that is, the packing unit (four transfers), respectively. As the respective data buffer 523 holds the unpacked data a to d input from the corresponding data-restoring units 522 by the packing unit (four transfers), the unpacked data A to D generated by the respective data-restoring unit 522 is held in the data buffer 523. The data buffers 523a to 523d sequentially output, for example, the held unpacked data A to D, for each pixel, that is, unpacked data a to d, to the selection unit 524 based on an output request signal, which is not shown, input from the selection unit 524. Further, the output request signal is a signal for sequentially reading the 9-bit unpacked data a to d held in the data buffer 523 selected by the selection unit 524. Accordingly, the output request signal is output only to any one data buffer 523 of the data buffers 523a to 523d selected by the selection unit 524.

The selection unit 524 selects any one data buffer 523 of the data buffers 523a to 523d according to the packed data selection bit input from the bit division unit 521. Also, for example, the selection unit 524 outputs the output request signal, which is not shown, to the selected data buffer 523 and outputs the unpacked data (any one of the unpacked data A to D) input from the selected data buffer 523 to the image-processing unit 50 as original pixel data. Further, as described above, the output request signal is a signal for sequentially reading the 9-bit unpacked data held in the selected data buffer 523. Accordingly, the selection unit 524 outputs the output request signal only to any one data buffer 523 of the selected data buffers 523a to 523d.

Thus, the data inverse-conversion unit 52 determines which of the plurality of prescribed packing methods has been used to pack the packed data output by the data conversion unit 41 based on the packed data selection bit added in the prescribed fixed position in the transfer data. The data inverse-conversion unit 52 outputs the unpacked data generated using a method that is reverse to the packing method selected by the data conversion unit 41 as original pixel data obtained by inversely converting the transfer data output by the data conversion unit 41, that is, restores it to the original pixel data.

Further, the data-restoring units 522a to 522d correspond to the packed data generation units 411a to 411d, respectively, as described above. However, the respective unpacked data a to d generated by the data-restoring unit 522 may not be the same as the original pixel data. This is because it is unclear which packed data generation unit 411 in the data conversion unit 41 has generated the input transfer packed data, that is, which of the packed data A to D shown in FIG. 2 is the input transfer packed data, at a time when the respective data-restoring units 522a to 522d generate the unpacked data a to d. Accordingly, the unpacked data a to d generated by the respective data-restoring units 522a to 522d is temporarily held in the corresponding data buffer 523, and any one unpacked data of the unpacked data A to D selected based on the packed data selection bit is output to the image-processing unit 50 as pixel data finally output by the data inverse-conversion unit 52.

Further, each time the transfer data is input from the input DMA unit 56, the respective data-restoring units 522a to 522d in the data inverse-conversion unit 52 can sequentially divide (unpack) the input transfer packed data as described above. However, the data inverse-conversion unit 52 may include, for example, a memory unit for temporarily holding 32-bit transfer data of one burst, that is, the packing unit (four transfers). In this case, the transfer data input from the input DMA unit 56 is temporarily held in the memory unit, and the held transfer data is first divided into the packed data selection bit and the transfer packed data. Thereafter, based on the packed data selection bit, the corresponding data-restoring unit 522 divides (unpacks) the transfer packed data using a method that is reverse to the prescribed packing method. Further, in this configuration, a memory unit arranged in a preceding stage of the bit division unit 521 has the same function as the data buffers 523a to 523d. Accordingly, it is possible to reduce the data buffers 523a to 523d in the data inverse-conversion unit 52 shown in FIG. 3.

Here, an example of the method of generating the packed data a to d in the packed data generation units 411a to 411d, that is, the plurality of prescribed packing methods (pixel data-arranging methods), will be described. In the imaging apparatus 1 of the present embodiment, the packed data generation unit 411a to 411d in the data conversion units 41 arranges the input pixel data in the memory bus to generate the packed data, and the data-restoring units 522a to 522d in the data inverse-conversion unit 52 restore the input transfer packed data to the original pixel data. Further, hereinafter, a case in which respective pixel data in Bayer data shown in FIG. 20 is sequentially input to the packed data generation unit 411 and packed as the packed data of one burst using four transfers as one packing unit will be described. Further, a bit number of each pixel data in the Bayer data is 9, and a width of the memory bus is 32 bits.

Further, since the method of restoring the transfer packed data to the original pixel data in the data-restoring unit 522a to 522d (an unpacking method) is a method that is reverse to the method of packing the pixel data in the packed data generation units 411a to 411d, a detailed description thereof will be omitted.

<First Data-Arranging Method>

Figure 4:
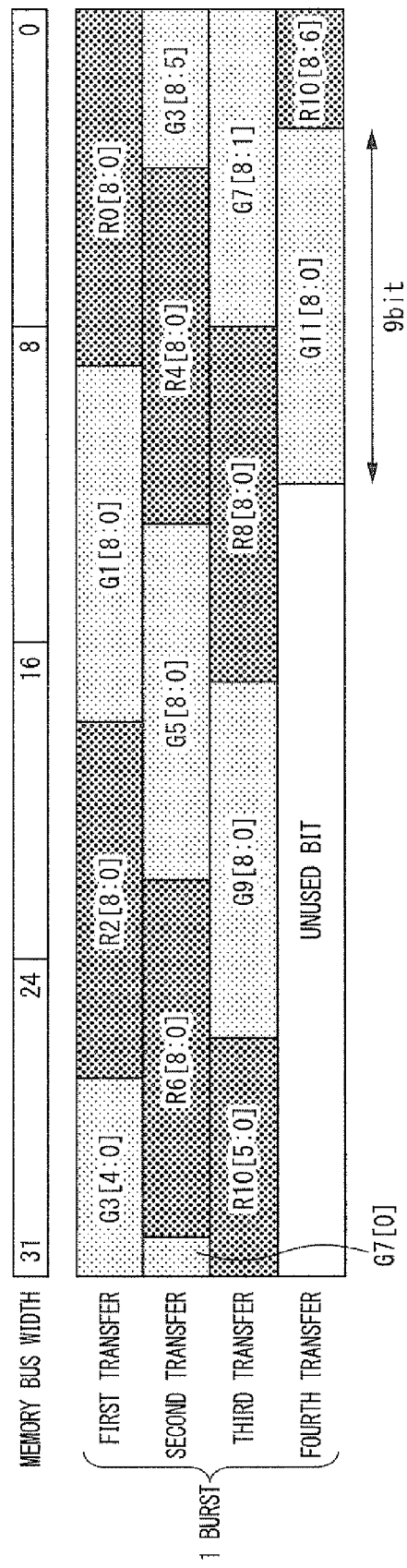
FIG. 4 is a diagram illustrating an example of a data-arranging method in a packed data generation unit included in the data conversion unit of the first configuration.

FIG. 4 is a diagram illustrating an example of a data-arranging method (a first packing method) in the packed data generation unit 411 included in the data conversion unit 41 of the first configuration. In FIG. 4, an arrangement of pixel data in packed data generated by the first packing method is shown.

In the first packing method, the packed data generation unit 411 sequentially arranges data of respective bits of input pixel data in respective bits of the memory bus to generate packed data having a bit number corresponding to a width of the memory bus. Further, since the first packing method is the same as the conventional burst unit-based packing method, a detailed description thereof will be omitted.

In FIG. 4, packed data obtained by the packed data generation unit 411 packing respective pixel data ("R0," "G1," "R2," "G3," "R4," "G5," "R6," "G7," "R8," "G9," "R10" and "G11") in Bayer data is shown. More specifically, a case in which the packed data generation unit 411 arranges (packs) bit [0] to bit [4] of "R0," "G1," "R2" and "G3" in the first transfer, bit [5] to bit [8] of "G3," "R4," "G5," "R6" and bit [0] of "G7" in the second transfer, bit [1] to bit [8] of "G7," "R8," "G9" and bit [0] to bit [5] of "R10" in the third transfer, and bit [6] to bit [8] of "R10", and "G11" in the fourth transfer, sequentially from the least significant bit of the memory bus is shown.

<Second Data-Arranging Method>

FIGS. 5A and 5B are diagrams illustrating another example (a second packing method) of the data-arranging method in the packed data generation unit 411 included in the data conversion unit 41 of the first configuration. In FIG. 5A, an arrangement of pixel data in packed data generated by the first packing method, that is, the conventional burst unit-based packing method, is shown. Further, in FIG. 5B, an arrangement of pixel data in packed data in which an arrangement of pixel data has been changed by the second packing method is shown.

In the second packing method, a packing unit for one burst (four transfers) is divided into pack area 1 and pack area 2, and each bit of the pixel data is arranged in each bit on the memory bus. Pack area 1 is an area in which respective continuous bits of the pixel data are directly arranged in respective continuous bits on the memory bus. In FIG. 5B, pack area 1 is an 18-bit area. Pack area 2 is an area in which respective bits of the pixel data are divided and arranged in bits on the memory bus in which the pixel data has not been arranged. In FIG. 5B, pack area 2 is a 14-bit area.

In the second packing method, the packed data generation unit 411 arranges the respective pixel data so that adjacent pixel data with the same color in data of pack area 1 in the packed data between two continuous transfers is arranged in the same bits on the memory bus. Further, the packed data generation unit 411 fills and arranges respective bits of the pixel data so that the pixel data is in raster order among four continuous transfers of pack area 2 in the packed data in which the pixel data has not been arranged.

Further, in the packed data generation unit 411 and the data-restoring unit 522, the same pack areas 1 and 2 are prescribed and positions of pixel data to be arranged in the respective areas are also determined in advance. Accordingly, the data-restoring unit 522 may restore the respective pixel data packed by the packed data generation unit 411 to original pixel data.

In FIG. 5B, packed data obtained by the packed data generation unit 411 packing respective pixel data ("R0," "G1," "R2," "G3," "R4," "G5," "R6," "G7," "R8," "G9," "R10" and "G11") in Bayer data is shown. More specifically, a case in which the packed data generation unit 411 sequentially arranges (packs) "R0" and "G1" in the first transfer of pack area 1, "R2" and "G3" in the second transfer, "R4" and "G5" in the third transfer, and "R6" and "G7" in the fourth transfer from the least significant bit of the memory bus is shown. Further, a case in which the packed data generation unit 411 sequentially packs "R8" and bit [0] to bit [4] of "G9" in the first transfer, bit [5] to bit [8] of "G9," "R10" and bit [0] of "G11" in the second transfer of pack area 2, and bit [1] to bit [8] of "G11" in the third transfer of pack area 2 from lower bits of the memory bus of pack area 2 is shown.

<Third Data-Arranging Method>

FIGS. 6A and 6B are diagrams illustrating still another example (a third packing method) of the data-arranging method in the packed data generation unit 411 included in the data conversion unit 41 of the first configuration. In FIG. 6A, an arrangement of pixel data in packed data generated by the first packing method, that is, the conventional burst unit-based packing method, is shown. Further, in FIG. 6B, an arrangement of pixel data in packed data in which an arrangement of pixel data has been changed by the third packing method is shown.

In the third packing method, the packed data generation unit 411 first sequentially arranges data of respective bits of input pixel data in respective bits of the memory bus to generate packed data having a bit number corresponding to the memory bus width, as in the first packing method. The packed data generation unit 411 bit-shifts data in each bit in each transfer pixel so that a bit at a boundary of the pixel data is arranged in a shift reference position set in advance, to thereby generate packed data, which is final packed data.

Further, the shift reference position is set in advance as a reference position in which positions of bits of adjacent pixel data with the same colors arranged on the memory bus in data between two continuous transfers when burst-transferring become the same, if possible. A direction and a shift amount for shifting the position of the bit of pixel data in each packed data to the shift reference position is set in advance. Accordingly, a change in the respective bits on the memory bus becomes smallest.

Further, in the packed data generation unit 411 and the data-restoring unit 522, the same shift reference position is set in advance and a shift direction and a shift amount of each bit of the pixel data in each packed data are set in advance. Accordingly, the data-restoring unit 522 may restore each packed pixel data to original pixel data by performing shifting by the same shift amount in a direction reverse to the shift direction in the packed data generation unit 411.

As shown in FIG. 6A, the packed data generation unit 411 first packs respective pixel data ("R0," "G1," "R2," "G3," "R4," "G5," "R6," "G7," "R8," "G9," "R10" and "G11") in Bayer data to generate packed data. More specifically, the packed data generation unit 411 arranges (packs) "R0," "G1," "R2" and [0] to bit [4] of "G3" in the first transfer bit, bit [5] to bit [8] of "G3", "R4," "G5," "R6" and bit [0] of "G7" in the second transfer, bit [1] to bit [8] of "G7", "R8," "G9" and bit [0] to bit [5] of "R10" in the third transfer, and [6] to bit [8] of "R10" and "G11" in the fourth transfer bit, sequentially from the least significant bit of the memory bus.

Next, the packed data generation unit 411 shifts the pixel data arranged in each bit in each transfer of the generated packed data. In an example of the packed data shown in FIG. 6A, the shift reference position is set in a position at a boundary between bit [8] of "G11" in the fourth transfer and a least significant bit of unused bits (bit [12] of the memory bus) in the fourth transfer. The packed data generation unit 411 shifts each bit of the respective packed data, as indicated by arrows shown in FIG. 6A, to generate packed data as shown in FIG. 6B. More specifically, the packed data generation unit 411 shifts the packed data of the first transfer to the right by 6 bits. Also, the packed data generation unit 411 shifts packed data of the second transfer to the right by 10 bits and packed data of the third transfer to the right by 14 bits. Accordingly, a position at a boundary between bit [8] of green pixel data and bit [0] of red pixel data contained in the packed data from the first transfer to the third transfer becomes the set shift reference position, as shown in FIG. 6B.

<Fourth Data-Arranging Method>

Figure 7A:
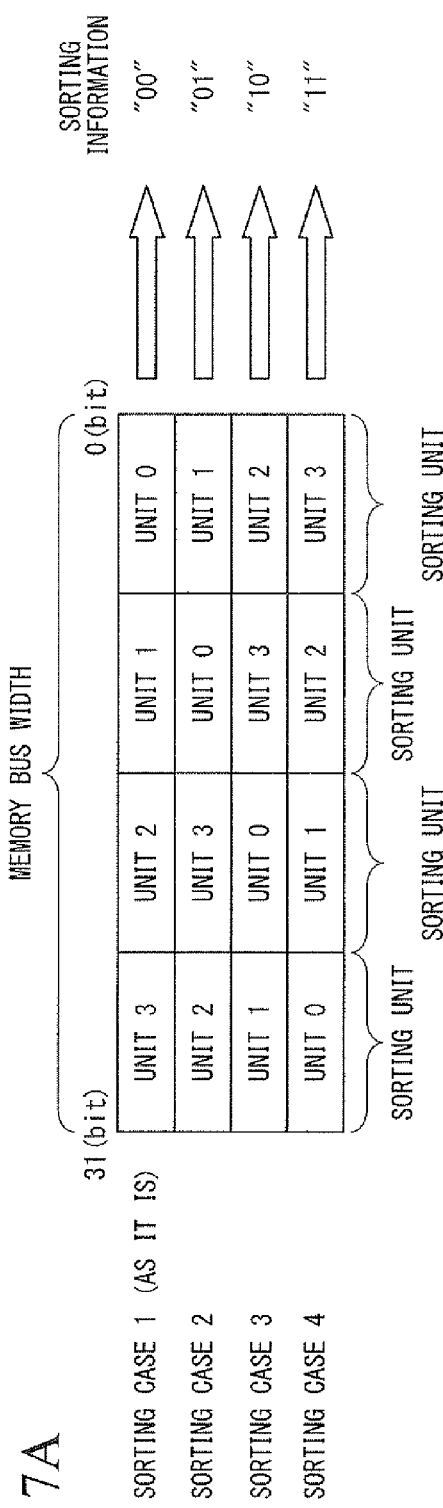
FIG. 7A is a diagram illustrating still another example of the data-arranging method in the packed data generation unit included in the data conversion unit of the first configuration.
Figure 7B:
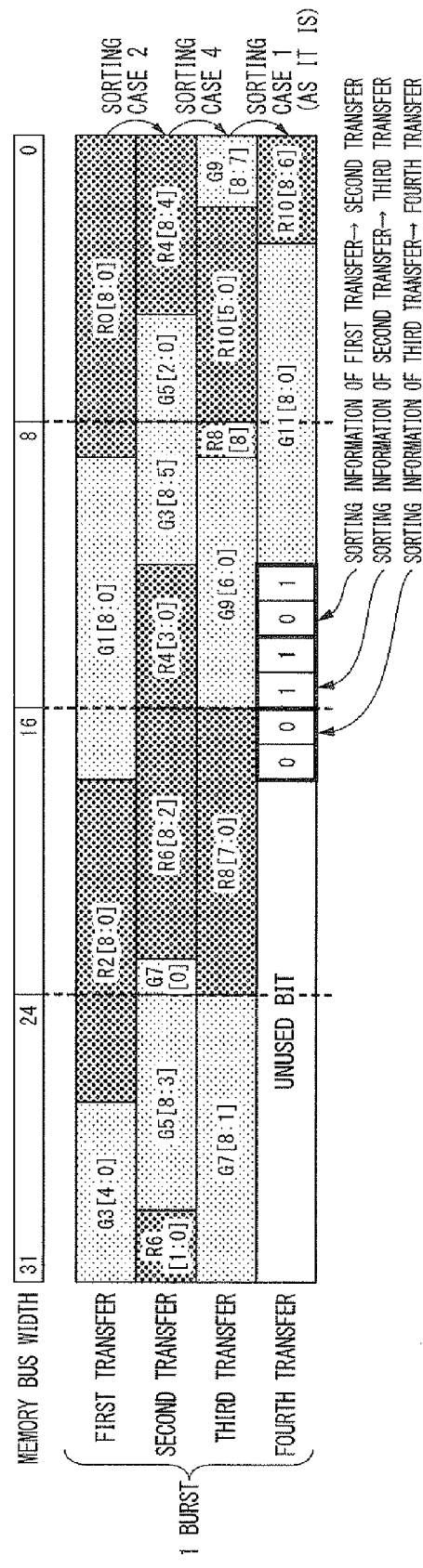
FIG. 7B is a diagram illustrating still another example of the data-arranging method in the packed data generation unit included in the data conversion unit of the first configuration.

FIGS. 7A and 7B are diagrams illustrating still another example (a fourth packing method) of the data-arranging method in the packed data generation unit 411 included in the data conversion unit 41 of the first configuration. FIG. 7A shows a combination of arrangements set in advance in the fourth packing method (sorting cases). FIG. 7B shows an arrangement of pixel data in packed data in which an arrangement of pixel data has been changed by the fourth packing method. A number subsequent to "Unit" in a table shown in FIG. 7A is information given to facilitate the explanation, for identifying a sorting unit (1-byte unit in FIGS. 7A and 7B). This number is given in order from a lower sorting unit (1 byte) when sorting of the packed data is not performed (sorting case 1), and is information for identifying to a position of which sorting unit the pixel data has been changed through an arrangement-changing process.

In the fourth packing method, the packed data generation unit 411 first sequentially arranges data of respective bits of input pixel data in respective bits of the memory bus to generate packed data having a bit number corresponding to a width of the memory bus, as in the first packing method. The packed data generation unit 411 compares respective bits of the pixel data in the packed data between two continuous transfers in each prescribed sorting unit (1-byte unit), and sorts the arrangement of the pixel data in the packed data in a range of the combination of prescribed sorting cases to generate packed data. Further, the packed data generation unit 411 adds information when the arrangement of the pixel data in the packed data is sorted (sorting information shown in FIG. 7A), in an unused bit in which pixel data has not been arranged, resulting in final packed data.

Further, in the packed data generation unit 411 and the data-restoring unit 522, the same sorting case is set in advance. Accordingly, the data-restoring unit 522 may recognize the sorting case used when the packed data generation unit 411 sorts the arrangement of the pixel data in the packed data, by confirming the added sorting information in the packed data. The data-restoring unit 522 may restore the respective packed pixel data to original pixel data by sorting the arrangement of pixel data in packed data into an arrangement reverse to the sorting case employed in the packed data generation unit 411, that is, the arrangement of the original pixel data.

When final packed data shown in FIG. 7B is generated by the fourth packing method, the packed data generation unit 411 first packs respective pixel data ("R0," "G1," "R2," "G3," "R4," "G5," "R6," "G7," "R8," "G9," "R10" and "G11") in Bayer data to generate packed data (see FIG. 4).

Next, the packed data generation unit 411 divides a width of the memory bus for the packed data into sorting units having a prescribed bit number (in FIG. 7B, 8 bit: 1 byte). Also, for example, the packed data generation unit 411 compares a value of each bit of packed data of the first transfer with a value of each bit of packed data of the second transfer and calculates the number of bits whose values have been changed for each sorting unit. The packed data generation unit 411 also selects a sorting combination (sorting case) in which the calculated number of bits whose values have changed becomes smallest. Also, the packed data generation unit 411 sorts the arrangement of the pixel data in the packed data of the second transfer to be the arrangement of the selected sorting case for each sorting unit to generate packed data.

A case in which a sorting case 2 is selected when the packed data of the first transfer is switched to the packed data of the second transfer in the arrangement of the respective pixel data in the packed data shown in FIG. 7B, and a sorting case 4 is selected when the packed data of the second transfer is switched to the packed data of the third transfer is shown. Further, when the packed data of the third transfer is switched to the packed data of the fourth transfer, sorting information when the arrangement of the pixel data in the packed data in each transfer is sorted is added (bit-coupled) in unused bits of the packed data of the fourth transfer, and accordingly, the sorting case 1 in which sorting is not performed is selected.

The packed data generation unit 411 bit-couples a value of sorting information corresponding to the selected sorting case to unused bits of the packed data of the fourth transfer (in FIG. 7B, bit "12" to bit "17" of the packed data of the fourth transfer). More specifically, the packed data generation unit 411 bit-couples sorting information ("01") corresponding to the sorting case 2 to bits "12" and "13" of the packed data of the fourth transfer, sorting information ("11") corresponding to the sorting case 4 to bits "14" and "15" of the packed data of the fourth transfer, and sorting information ("00") corresponding to the sorting case 1 to bits "16" and "17" of the packed data of the fourth transfer.

<Fifth Data-Arranging Method>

FIGS. 8A, 8B and 8C are diagrams illustrating still another example (a fifth packing method) of the data-arranging method in the packed data generation unit 411 included in the data conversion unit 41 of the first configuration. FIG. 8A shows an example of input pixel data. FIG. 8B shows an example of pixel data after an inversion process is performed in the fifth packing method. FIG. 8C shows an arrangement of pixel data in packed data in which the pixel data inversion-processed using the fifth packing method is arranged.

In the fifth packing method, the packed data generation unit 411 first sequentially arranges data of respective bits of input pixel data in respective bits of the memory bus to generate packed data having a bit number corresponding to a width of the memory bus, as in the first packing method. The packed data generation unit 411 divides the respective pixel data arranged in packed data of one transfer into prescribed upper bits and lower bits. The packed data generation unit 411 collects and inversion-processes the lower bits of the pixel data, couples the upper bits of the respective pixel data to the lower bits of the respective pixel data subjected to the inversion process, and respectively arranges the coupled pixel data in the memory bus of one transfer. Also, the packed data generation unit 411 adds information (an inversion bit shown in FIG. 8B) when the lower bits of the pixel data are inversion-processed in an unused bit of the memory bus of one transfer to generate final packed data of one transfer.

Here, the inversion process in the fifth packing method will be described with reference to FIGS. 8A and 8B. In the following description, a case in which 8-bit pixel data is sequentially input in time-series from a top column to a bottom column will be described in order to facilitate explanation. Each time pixel data is input, the packed data generation unit 411 sequentially compares values of respective bits of the lower input pixel data. More specifically, the packed data generation unit 411 compares values of respective bits of the lower input pixel data in the respective columns of the input pixel data shown in FIG. 8A with values of the lower input pixel data in the top column to calculate a bit change number. Accordingly, the bit change number of the lower input pixel data as shown in FIG. 8A is obtained.

Also, when the calculated bit change number exceeds a half of the lower input pixel data, the packed data generation unit 411 inverts each bit of the lower input pixel data ("1"→"0" or "0" 43 "1") to generate lower output pixel data subjected to the inversion process. The packed data generation unit 411 couples the upper input pixel data and the lower output pixel data to generate final output pixel data. Further, the packed data generation unit 411 adds an inversion bit (see FIG. 8B) indicating that data is output pixel data subjected to the inversion process to the final output pixel data. In FIG. 8B, when the output pixel data is data subjected to the inversion process, the value of the inversion bit is "1," and when the output pixel data is data not subjected to the inversion process, the value of the inversion bit is "0." Thus, in the fifth packing method, a change in the respective bits on the memory bus is decreased through the inversion process.

Further, the packed data generation unit 411 and the data-restoring unit 522 share content indicated by the value of the inversion bit, that is, information indicating whether the inversion process has been performed. Accordingly, the data-restoring unit 522 may determine whether the packed data generation unit 411 has performed the inversion process by confirming the inversion bit. The data-restoring unit 522 may restore the respective packed pixel data to original pixel data by inversion-processing the data (more specifically, the lower pixel data) that has been inversion-processed by the packed data generation unit 411.

When the final packed data shown in FIG. 8C is generated using the fifth packing method, the packed data generation unit 411 first packs respective pixel data ("R0," "G1," "R2," "G3," "R4," "G5," "R6," "G7," "R8," "G9," "R10" and "G11") in Bayer data to generate packed data. More specifically, the packed data generation unit 411 arranges (packs) "R0," "G1" and "R8" in the first transfer, "R2," "G3" and "R10" in the second transfer, "R4," "G5" and "G9" in the third transfer, and "R6," "G7" and "G11" in the fourth transfer, sequentially from the least significant bit of the memory bus, respectively.

Next, the packed data generation unit 411 collects and inversion-processes the lower bits of the pixel data arranged in the packed data of each transfer (e.g., bits [0] to [3] of "R0," "G1" and "R8" in the packed data of the first transfer). The packed data generation unit 411 bit-couples the inversion bit when the lower bits of the pixel data are inversion-processed, to an unused bit in the packed data in each transfer (bit [27] of the memory bus in FIG. 8C).

Next, transfer data output by the data conversion unit 41 will be described. FIGS. 9A and 9B are diagrams illustrating transfer data output from the data conversion unit 41 of the first configuration. As described above, the data conversion unit 41 sequentially outputs 32-bit transfer data in which data of each bit of 9-bit pixel data sequentially input from the imaging-processing unit 40 is arranged in each bit on the memory bus, for example, based on a data enable signal, which is not shown, input from the output DMA unit 45.

The data conversion unit 41 includes packed data generation units 411a to 411d for arranging (packing) the pixel data for one burst, that is, the packing unit (four transfers) in the input pixel data to generate packed data A to D using any one of the first to fifth packing methods described above. The comparison unit 417 selects the packed data of which the data change on the memory bus is smallest as transfer packed data, and outputs a packed data selection bit indicating the packed data selected as the transfer packed data. In the comparison unit 417, for example, values of the packed data selection bit corresponding to the packed data selected as the transfer packed data are set in advance, as shown in FIG. 9A. Further, in a correspondence between the transfer packed data and the packed data selection bit shown in FIG. 9A, since the respective packed data selection bits corresponding to the four packed data generation units 411 are set in advance, a bit number of the packed data selection bit is 2.

The bit-coupling unit 419 outputs, for example, transfer packed data in which the packed data selection bit is added in a prescribed fixed position in the transfer data of one burst as shown in FIG. 9B to the output DMA unit 45 as transfer data finally output by the data conversion unit 41, for each burst. In FIG. 9B, a case in which the fixed position in which the packed data selection bit is added has been set as 2 bits (more specifically, bit [31] and bit [30] of the memory bus) from the most significant bit of the packed data of the fourth transfer in advance is shown. In FIG. 9B, transfer data for 2 bursts is also shown.

The data conversion unit 41 and the data inverse-conversion unit 52 share information of the fixed position in which the packed data selection bit is added. Also, the data conversion unit 41 and the data inverse-conversion unit 52 share the correspondence between the selected packed data and the values of the packed data selection bit as shown in FIG. 9A, that is, information of the transfer data-packing method indicated by the values of the packed data selection bit. Accordingly, the data inverse-conversion unit 52 may determine the packing method applied to the transfer data output from the data conversion unit 41, by confirming the packed data selection bit. Also, the data inverse-conversion unit 52 may select unpacked data of one burst, that is, the packing unit (four transfers) obtained by sequentially dividing (unpacking) the respective data arranged in the respective bits of the transfer packed data using a method that is reverse to the packing method applied to the transfer data, as the original pixel data.

As described above, the data conversion unit 41 and 51 of the first configuration may select and output packed data of which the change amount of each bit of the memory bus is smallest in burst transfer from among the respective packed data generated using the plurality of packing methods. Also, the data conversion unit 41 and 51 outputs the packed data selection bit indicating the selected packed data (packing method) together with the transfer data. Accordingly, in the data conversion units 41 and 51 of the first configuration, it may realize data transfer capable of greatly reducing power consumption due to the image data transfer, by selecting the packing method optimal to pixel data to be transferred. Accordingly, it may reduce power consumption due to pixel data transfer between each component (processing block) and the memory 20 in the imaging apparatus 1, that is, delivery of pixel data between components in the imaging apparatus 1.

<Second Configuration>

Figure 10:
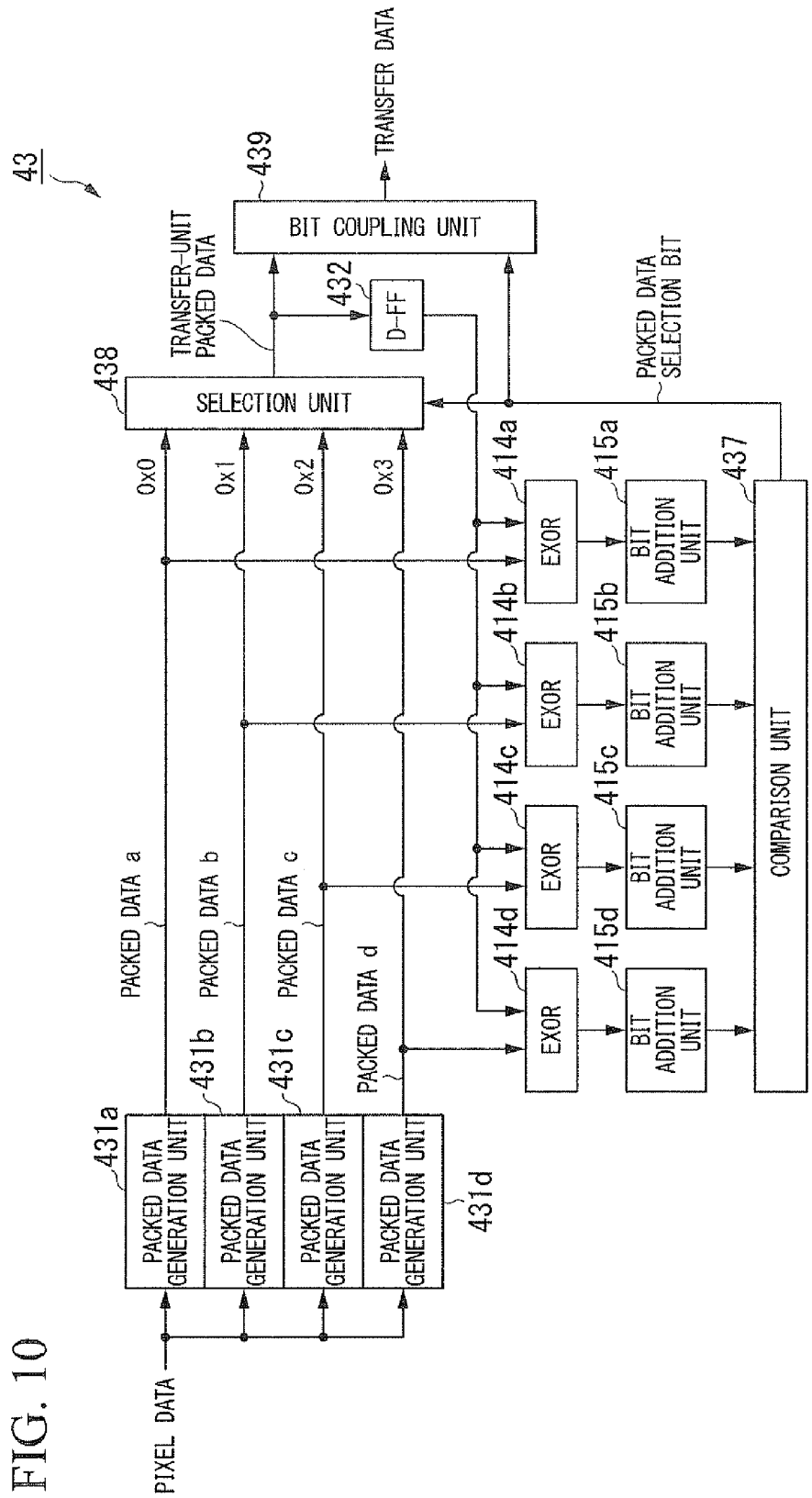
FIG. 10 is a block diagram showing a schematic configuration of a data conversion unit of a second configuration included in the imaging apparatus of the present embodiment.

Next, a data conversion unit of a second configuration will be described. FIG. 10 is a block diagram showing a schematic configuration of the data conversion unit 43 of the second configuration included in the imaging apparatus 1 of the present embodiment. The data conversion unit 43 shown in FIG. 10 is included in the imaging apparatus 1 in place of the data conversion unit 41 of the first configuration. Accordingly, the data conversion unit 43 may be included in the imaging apparatus 1 in place of the data conversion unit 51. As shown in FIG. 10, the data conversion unit 43 includes four packed data generation units 431a to 431d, a D-FF 432, four EXOR (exclusive OR) circuits 414a to 414d, four bit addition units 415a to 415d, a comparison unit 437, a selection unit 438, and a bit-coupling unit 439. Hereinafter, "any one" of the packed data generation units 431a to 431d, the EXOR circuits 414a to 414d, or the bit addition units 415a to 415d is represented as follows:

Any one of the packed data generation units 431a to 431d: "packed data generation unit 431"

Any one of the EXOR circuits 414a to 414d: "EXOR circuit 414"

Any one of the bit addition units 415a to 415d: "bit addition unit 415"

The data conversion unit 43 of the second configuration includes the packed data generation unit 431 in place of the packed data generation unit 411 in the data conversion unit 41 of the first configuration shown in FIG. 2. The data conversion unit 43 includes the D-FF 432 in place of the D-FF 412. The data conversion unit 43 includes the comparison unit 437 in place of the comparison unit 417. The data conversion unit 43 includes the selection unit 438 in place of selection unit 418. Further, the data conversion unit 43 includes the bit-coupling unit 439 in place of bit-coupling unit 419. Further, the burst-unit buffer 413 and the burst-unit accumulation unit 416 in the data conversion unit 41 are removed. In the following description, the same reference numerals are given to the same components as those in the data conversion unit 41 of the first configuration, and a detailed description thereof will be omitted.

Hereinafter, a case in which the 16×16 Bayer data as shown in FIG. 20 is input to the data conversion unit 43, four transfers constitute a packing unit for each pixel data in the Bayer data, a bit number of each pixel data in the Bayer data is 9, and a width of a memory bus is 32 bits, as in the first configuration, will be described.

The data conversion unit 43 arranges data of each bit of 9-bit pixel data sequentially input from the imaging-processing unit 40, in each bit on the memory bus, to output 32-bit transfer data using any one of prescribed packing methods, which will be described later, similar to the data conversion unit 41 of the first configuration. However, the method of generating the transfer data in the data conversion unit 43 differs from that in the data conversion unit 41 of the first configuration. More specifically, the data conversion unit 41 selects the packed data of which the bit change on the memory bus is smallest in units of the transfer packed data of one burst (four transfers) while the data conversion unit 43 selects the packed data of which the bit change on the memory bus is smallest in packed data of each transfer.

When the data conversion unit 43 generates the transfer data, the data conversion unit 43 first packs the input pixel data to generate a plurality of packed data using a plurality of prescribed packing methods, respectively. The data conversion unit 43 selects the packed data of one transfer of which the bit change on the memory bus is smallest (hereinafter referred to as "transfer-unit packed data") from among the generated packed data of the respective transfers. Thereafter, the data conversion unit 43 adds information when the packed data is selected (packed data selection bit), in an unused bit present in the transfer-unit packed data, that is, the packed data of one transfer, to output the transfer-unit packed data as transfer data to be finally output.

The packed data generation units 431a to 431d arrange data of respective bits of input pixel data in respective bits of the data bus corresponding to the memory bus to sequentially generate packed data of one transfer having a bit number of the memory bus width (32 bits in the data conversion unit 43 of the second configuration), using a prescribed packing method. Further, since this data bus corresponds to respective bits of the memory bus, it will be hereinafter described as a "memory bus."

Also, the respective packed data generation units 431a to 431d sequentially output the generated packed data of one transfer to the selection unit 438 and the corresponding EXOR circuits 414a to 414d.

Further, the packed data of one transfer generated by the respective packed data generation units 431a to 431d corresponds to the packed data a to d of one transfer of packed data A to D of one burst generated by the respective packed data generation units 411 in the data conversion unit 41. Accordingly, even in the following description, the packed data of one transfer generated by the respective packed data generation units 431a to 431d is referred to as packed data a to d, respectively. Further, examples of the packing method in each packed data generation unit 431 and the packed data will be described in detail later.

The selection unit 438 selects any one packed data generation unit 431 from among the packed data generation units 431a to 431d according to the packed data selection bit input from the comparison unit 437. Also, the selection unit 438 outputs the packed data output from the selected packed data generation unit 431 (any one packed data among the packed data a to d) to the bit-coupling unit 439 as transfer-unit packed data. Further, the selection unit 438 includes a memory unit for temporarily holding the packed data a to d input from the respective packed data generation units 431a to 431d, to thereby take timing matching with the packed data selection bit input from the comparison unit 437 and select transfer-unit packed data.

The D-FF 432 holds the transfer-unit packed data output from the selection unit 438. The transfer-unit packed data held in the D-FF 432 is output to each of the EXOR circuits 414a to 414d. Further, the transfer-unit packed data corresponds to any one of the packed data a to d output by the packed data generation unit 431 in one previous transfer.

The EXOR circuits 414a to 414d compare values of the respective bits of two packed data: the 32-bit packed data a to d output from the corresponding packed data generation units 431a to 431d and the 32-bit transfer-unit packed data output from the D-FF 432, for each bit. Each of the EXOR circuits 414a to 414d outputs "0" when the values of the bits of the two packed data are equal and "1" when the values of the bits of the two packed data differ, for each compared bit.

Further, the EXOR circuits 414a to 414d compare the values of the respective bits using the transfer-unit packed data input from the D-FF 432 as previous packed data a to d output by the respective packed data generation units 431a to 431d in the same packing unit (four transfers). Accordingly, a comparison between the previous packed data and the current packed data a to d is performed irrespective of which packed data generation unit 431 of the packed data generation units 431a to 431d generates the previous transfer-unit packed data output by the data conversion unit 43.

Further, when the current packed data a to d output from the packed data generation units 431 is packed data a to d of the first transfer, a value ("0") indicating that the values of the bits have not been changed is output for all the bits.

The bit addition units 415a to 415d count the number of bits whose values have been changed, which are input from the corresponding EXOR circuits 414a to 414d, to calculate a bit change number. Accordingly, when a value of the previous packed data output by any one packed data generation unit 431 of the packed data generation units 431a to 431d (the transfer-unit packed data output from the D-FF 432) is changed into a value of the current packed data a to d output next by the packed data generation units 431a to 431d, the number of bits whose values on the memory bus are changed into the other values (the bit change number) is calculated by each packed data generation unit 431. Each of the bit addition units 415a to 415d outputs the calculated bit change number to the comparison unit 437.

The comparison unit 437 determines the bit addition unit 415 outputting the smallest bit change number among the bit change numbers input from the respective bit addition units 415a to 415d, and specifies (selects) the bit addition unit 415 outputting the smallest bit change number. Also, the comparison unit 437 outputs information indicating the bit addition unit 415 outputting the smallest bit change number, that is, information indicating a packing method in which a bit change on the memory bus is smallest, as the packed data selection bit, to the selection unit 438 and the bit-coupling unit 439. Accordingly, the packed data of which the bit change on the memory bus is smallest in the packed data of one transfer (transfer-unit packed data) is selected.

Further, values of the packed data selection bit corresponding to the respective packed data generation units 431 included in the data conversion unit 43 are determined in advance. Also, the same values as those in the data conversion unit 43 are determined in the data inverse-conversion unit corresponding to the data conversion unit 43 in advance. This enables the data inverse-conversion unit corresponding to the data conversion unit 43 to determine the packing method selected in the data conversion unit 43.

The bit-coupling unit 439 adds the packed data selection bit input from the comparison unit 437, in an unused bit present in the transfer-unit packed data input from the selection unit 438, that is, the packed data of one transfer. Also, the bit-coupling unit 439 outputs the transfer-unit packed data having the packed data selection bit added thereto, to the output DMA unit 45, as transfer data finally output by the data conversion unit 43.

Further, as a position of the unused bit in the transfer-unit packed data in which the bit-coupling unit 439 adds the packed data selection bit, a fixed position of an unused bit common to all the packed data a to d of one transfer generated by the packed data generation units 431a to 431d is determined in advance. Also, the same position as the fixed position of the common unused bit in the packed data a to d has been determined in the data inverse-conversion unit corresponding to the data conversion unit 43 in advance as the position of the unused bit in which the packed data selection bit has been added. This enables the data inverse-conversion unit corresponding to the data conversion unit 43 to inversely convert the transfer data output by the data conversion unit 43 and restore the original pixel data based on the packed data selection bit added in the fixed position.

Figure 11:
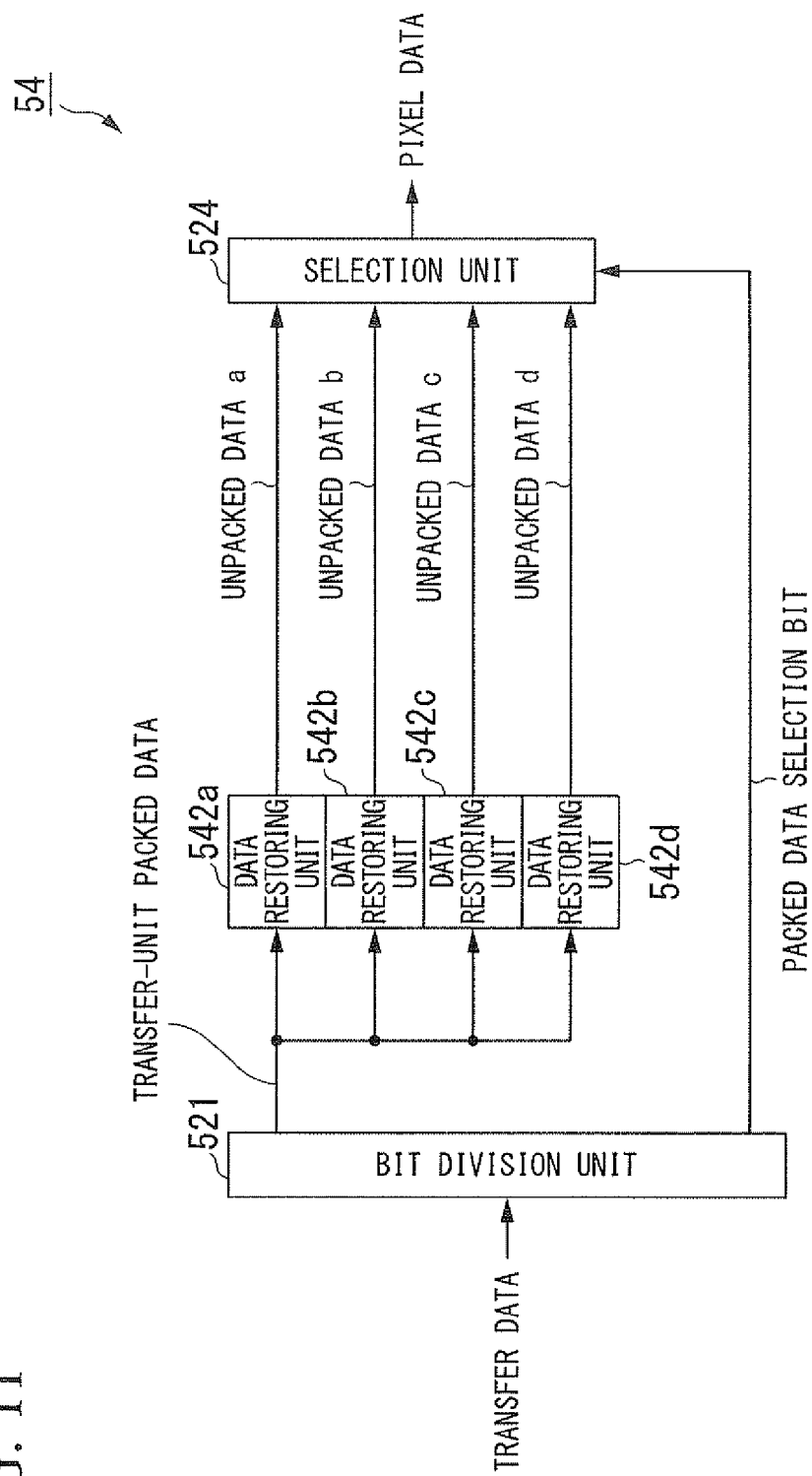
FIG. 11 is a block diagram showing a schematic configuration of a data inverse-conversion unit of a second configuration included in the imaging apparatus of the present embodiment.

Next, the data inverse-conversion unit of the second configuration will be described. FIG. 11 is a block diagram showing a schematic configuration of the data inverse-conversion unit 54 of the second configuration included in the imaging apparatus 1 of the present embodiment.

The data inverse-conversion unit 54 shown in FIG. 11 is included in the imaging apparatus 1 in place of the data inverse-conversion unit 52 of the first configuration. Accordingly, the data inverse-conversion unit 54 may be included in the imaging apparatus 1 in place of the data inverse-conversion unit 62. As shown in FIG. 11, the data inverse-conversion unit 54 includes a bit division unit 521, four data-restoring units 542a to 542d, and a selection unit 524. Hereinafter, any one of the data-restoring units 542a to 542d is represented as "data-restoring unit 542."

The data inverse-conversion unit 54 of the second configuration includes the data-restoring unit 542 in place of the data-restoring unit 522 in the data inverse-conversion unit 52 of the first configuration shown in FIG. 3, and the data buffer 523 is removed. In the following description, the same reference numerals are given to the same components as those of the data inverse-conversion unit 52 of the first configuration, and a detailed description thereof will be omitted.

Hereinafter, a case in which the packed data of one burst in which four transfers constitute a packing unit, which has been packed by the data conversion unit 43, is input to the data inverse-conversion unit 54 via the input DMA unit 56 and restored to the Bayer data shown in FIG. 20 as in the first configuration, will be described. Accordingly, a description will be given on the assumption that a bit number of each pixel data in the Bayer data is 9 bits and a memory bus width is 32 bits.

The data inverse-conversion unit 54 restores the data arranged in each bit of the 32-bit transfer data input from the input DMA unit 56 to original image data (Bayer data) to be image-processed by the image-processing unit 50 using a method that is reverse to any one of prescribed packing methods, which will be described later, to restore the 9-bit pixel data, similar to the data inverse-conversion unit 52 of the first configuration. However, a method of restoring the original pixel data in the data inverse-conversion unit 54 differs from that in the data inverse-conversion unit 52 of the first configuration. More specifically, the data inverse-conversion unit 52 restores the original pixel data based on the packed data selection bit added in the fixed position of any of the transfer packed data for one burst (four transfers) while the data inverse-conversion unit 54 restores to the original pixel data based on the packed data selection bit added in each packed data of one transfer.

Further, the same fixed position as the position of the unused bit in which the packed data selection bit has been added by the data conversion unit 43 as described above is determined in the data inverse-conversion unit 54 in advance. When the data inverse-conversion unit 54 restores the pixel data, the data inverse-conversion unit 54 sequentially divides the 32-bit transfer data input in each transfer into the packed data selection bit, and the packed data obtained by the packed data generation unit 431 in the data conversion unit 43 packing the pixel data. This transfer data is the same as the transfer data generated by the data conversion unit 43. Further, since this packed data is the transfer-unit packed data selected by the selection unit 438 in the data conversion unit 43, it is referred to as "transfer-unit packed data" in the following description. The data inverse-conversion unit 54 sequentially divides (unpacks) the transfer-unit packed data of each transfer to sequentially generate unpacked data corresponding to the pixel data using a method that is reverse to the packing method in the data conversion unit 43. Thereafter, the data inverse-conversion unit 54 selects, in each transfer, the same unpacked data as the pixel data input to the data conversion unit 43 from among the unpacked data based on the packed data selection bit to sequentially output it as original pixel data.

The bit division unit 521 sequentially divides, in each transfer, the transfer data input from the input DMA unit 56 into the packed data selection bit added in the prescribed fixed position in the transfer data, and the transfer-unit packed data. The bit division unit 521 sequentially outputs, in each transfer, the divided transfer-unit packed data to the data-restoring unit 542. Also, the bit division unit 521 sequentially outputs, in each transfer, the divided packed data selection bit to the selection unit 524.

The data-restoring units 542a to 542d correspond to the packed data generation units 431a to 431d, respectively, and sequentially divide (unpack) the transfer-unit packed data input from the bit division unit 521 into each data (9-bit data in the data inverse-conversion unit 54 of the second configuration) arranged in each bit of the transfer-unit packed data to generate unpacked data for one transfer using a method that is reverse to a prescribed packing method. Also, the data-restoring units 542a to 542d sequentially output the generated unpacked data for each pixel, that is, a bit number of the pixel data (9 bits in the data inverse-conversion unit 54 of the second configuration), to the selection unit 524.

Further, the unpacked data for the respective pixels generated by the data-restoring units 542a to 542d corresponds to unpacked data a to d for each pixel generated by the data-restoring unit 522 in the data inverse-conversion unit 52. Accordingly, even in the following description, the unpacked data for each pixel output by the respective data-restoring units 542a to 542d is referred to as unpacked data a to d.

The selection unit 524 selects one data-restoring unit 542 of the data-restoring units 542a to 542d according to the packed data selection bit input from the bit division unit 521. The selection unit 524 sequentially outputs the unpacked data input from the selected data-restoring unit 542 (any one of the unpacked data a to d) to the image-processing unit 50 as original pixel data. Also, the selection unit 524 includes a memory unit for temporarily holding the unpacked data a to d input from the respective data-restoring units 542a to 542d to take matching of a timing with the packed data selection bit input from the bit division unit 521 and select original pixel data.

Thus, the data inverse-conversion unit 54 determines which of the plurality of prescribed packing methods has been used to pack the packed data output by the data conversion unit 43 based on the packed data selection bit added in the prescribed fixed position of each transfer data. The data inverse-conversion unit 54 outputs the unpacked data generated using a method that is reverse to the packing method selected by the data conversion unit 43, as original pixel data obtained by inversely converting the transfer data output by the data conversion unit 43, that is, restores the original pixel data.

Further, the data-restoring units 542a to 542d correspond to the packed data generation units 431a to 431d, respectively, as described above. However, the unpacked data a to d generated by the data-restoring unit 542 may not be the same as the original pixel data. This is because it is unclear which packed data generation unit 431 in the data conversion unit 43 has generated the input transfer-unit packed data, that is, which of the packed data a to d shown in FIG. 10 is the input transfer-unit packed data, at a time when the data-restoring units 542a to 542d generate the unpacked data a to d respectively, similar to the data inverse-conversion unit 52 of the first configuration. Accordingly, any one unpacked data selected from among the unpacked data a to d generated by the data-restoring units 542a to 542d based on the packed data selection bit is output to the image-processing unit 50 as the pixel data finally output by the data inverse-conversion unit 54.

An example of a method of generating the packed data a to d in the packed data generation units 431a to 431d, that is, a plurality of prescribed packing methods (pixel data-arranging methods), will be described herein. In the imaging apparatus 1 of the present embodiment, the packed data generation units 431a to 431d in the data conversion unit 43 arrange the input pixel data on the memory bus to generate the packed data, and the data-restoring units 542a to 542d in the data inverse-conversion unit 54 restores the input transfer-unit packed data to the original pixel data. Further, a case in which the respective pixel data in Bayer data shown in FIG. 20 is sequentially input to the packed data generation unit 431 and packed as packed data of one burst using four transfers as one packing unit will be described hereinafter. Further, a bit number of each pixel data in the Bayer data is 9 bits, and the memory bus width is 32 bits.

Further, since the method (unpacking method) of restoring the transfer-unit packed data to the original pixel data in the data-restoring units 542a to d is a method that is reverse to the method of packing the pixel data in the packed data generation units 431a to d, a detailed description thereof will be omitted.

<Sixth Data-Arranging Method>

Figure 12:
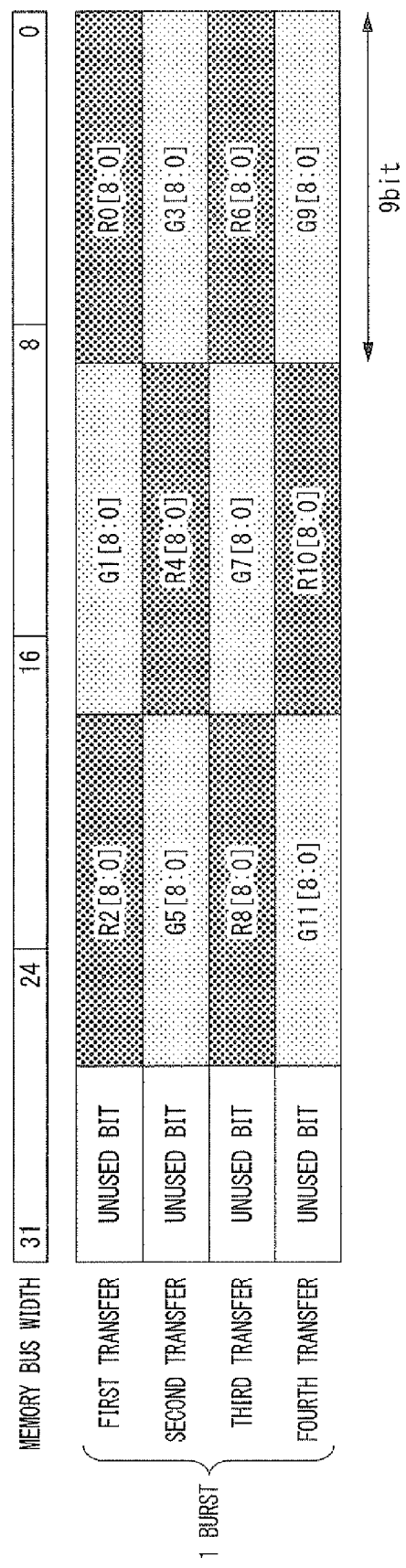
FIG. 12 is a diagram illustrating an example of a data-arranging method in a packed data generation unit included in the data conversion unit of the second configuration.

FIG. 12 is a diagram illustrating an example (a sixth packing method) of the data-arranging method in the packed data generation unit 431 included in the data conversion unit 43 of the second configuration. In FIG. 12, an arrangement of pixel data in packed data generated using the sixth packing method is shown.

In the sixth packing method, the packed data generation unit 431 sequentially arranges data of respective bits of input pixel data in respective bits of the memory bus to generate packed data having a bit number corresponding to a width of the memory bus. Further, since the sixth packing method is the same as a conventional packing method, a detailed description thereof will be omitted.

In FIG. 12, packed data when the packed data generation unit 431 packs pixel data of three pixels in one transfer and transfers respective pixel data in Bayer data, i.e., pixel data of 12 pixels ("R0," "G1," "R2," "G3," "R4," "G5," "R6," "G7," "R8," "G9," "R10" and "G11") in one burst (four transfers) is shown. More specifically, a case in which the packed data generation unit 431 arranges (packs) "R0," "G1" and "R2" in the first transfer, "G3," "R4" and "G5" in the second transfer, "R6," "G7" and "R8" in the third transfer and "G9," "R10" and "G11" in the fourth transfer, sequentially from the least significant bit of the memory bus is shown.

Further, in the sixth packing method, when all bits of pixel data in the packed data for one transfer cannot be arranged, next pixel data is not packed. This is because, in the sixth packing method, each pixel data is packed using one transfer as a packing unit, and accordingly, packing of next pixel data causes the pixel data to exceed the packing unit. Accordingly, bits of the memory bus in which the pixel data has not been arranged (in FIG. 12, bit [31] to bit [27] of the memory bus of each transfer) are unused bits.

<Seventh Data-Arranging Method>

FIGS. 13A and 13B are diagrams illustrating another example (a seventh packing method) of the data-arranging method in the packed data generation unit 431 included in the data conversion unit 43 of the second configuration. FIG. 13A shows an arrangement of pixel data in packed data generated using the sixth packing method, that is, the previous packing method. Further, FIG. 13B shows an arrangement of pixel data in packed data in which an arrangement of the pixel data has been changed using the seventh packing method.

In the seventh packing method, a packing unit for one burst (four transfers) is divided into pack area 1 (in FIG. 13B, 18-bit area) and pack area 2 (in FIG. 13B, 14-bit area) and each bit of the pixel data is arranged in each bit on the memory bus. In the seventh packing method, the packed data generation unit 431 changes a position of the pixel data arranged in each transfer so that adjacent pixel data with the same colors in data between two continuous transfers of pack area 1 in the packed data is arranged in the same bits on the memory bus. Further, the packed data generation unit 431 arranges pixel data not arranged in pack area 1 in each transfer, in pack area 2 in the packed data in which pixel data has not been arranged.

Further, in the packed data generation unit 431 and the data-restoring unit 542, the same pack areas 1 and 2 are determined in advance, and positions of pixel data to be arranged in the respective areas are also determined in advance. Accordingly, the data-restoring unit 542 may restore the respective packed pixel data packed by the packed data generation unit 431 to the original pixel data.

In FIG. 13B, packed data obtained by the packed data generation unit 431 packing respective pixel data ("R0," "G1," "R2," "G3," "R4," "G5," "R6," "G7," "R8," "G9," "R10" and "G11") in Bayer data is shown. More specifically, a case in which the packed data generation unit 431 sequentially arranges (packs) "R0," "G1" and "R2" in the first transfer, "R4," "G3" and "G5" in the second transfer, "R6," "G7" and "R8" in the third transfer, and "R10," "G9" and "G11" in the fourth transfer, from the least significant bit of the memory bus is shown.

<Eighth Data-Arranging Method>

FIGS. 14A and 14B are diagrams illustrating still another example (an eighth packing method) of the data-arranging method in the packed data generation unit 431 included in the data conversion unit 43 of the second configuration. FIG. 14A shows an arrangement of pixel data in packed data generated using the sixth packing method, that is, the previous packing method. Further, FIG. 14B shows an arrangement of pixel data in packed data in which an arrangement of pixel data has been changed using the eighth packing method.

In the eighth packing method, the packed data generation unit 431 first sequentially arranges data of respective bits of input pixel data in respective bits of the memory bus to generate packed data having a bit number corresponding to a width of the memory bus, as in the sixth packing method. The packed data generation unit 431 sorts the arrangement of the pixel data arranged in packed data of the same transfer so that bits at a boundary of the pixel data are arranged in a previously set sorting reference position.

The packed data obtained by sorting the arrangement of the pixel data is final packed data of one transfer.

Further, the sorting reference position is set in advance as a position of a reference bit in which positions of bits of adjacent pixel data with the same colors arranged on the memory bus in data between two continuous transfers when burst-transferring become the same, if possible. Also, a sorting method for causing a position of pixel data in each packed data to be the sorting reference position is set for each transfer in advance. Accordingly, a change in the respective bits on the memory bus becomes smallest.

Further, in the packed data generation unit 431 and the data-restoring unit 542, the same sorting reference position is determined in advance and a method of sorting pixel data in each packed data is determined in advance. Accordingly, the data-restoring unit 542 may restore each packed pixel data to original pixel data by sorting using a method that is reverse to the sorting method in the packed data generation unit 431.

As shown in FIG. 14A, the packed data generation unit 431 first packs respective pixel data ("R0," "G1," "R2," "G3," "R4," "G5," "R6," "G7," "R8," "G9," "R10" and "G11") in Bayer data to generate packed data. More specifically, the packed data generation unit 431 arranges (packs) "R0," "G1" and "R2" in the first transfer, "G3," "R4" and "G5" in the second transfer, "R6," "G7" and "R8" in the third transfer, and "G9," "R10" and "G11" in the fourth transfer, sequentially from the least significant bit of the memory bus.

Next, the packed data generation unit 431 sorts the pixel data arranged in packed data of each transfer of the generated packed data. In an example of packed data shown in FIG. 14A, the sorting reference position is set in a position at a boundary between bit [17] and bit [18] of the memory bus. The packed data generation unit 431 sorts an arrangement of pixel data in packed data of each transfer as indicated by arrows shown in FIG. 14A to generate packed data of each transfer as shown in FIG. 14B. More specifically, the packed data generation unit 431 sorts "G1" and "R2" in packed data of the first transfer. Also, the packed data generation unit 431 sorts "R4" and "G5" in packed data of the second transfer, "G7" and "R8" in packed data of the third transfer, and "R10" and "G11" in the packed data of the fourth transfer. Accordingly, the arrangements of the respective pixel data contained in the packed data of the first to fourth transfers are sorted, as shown in FIG. 14B.

<Ninth Data-Arranging Method>

Figure 15A:
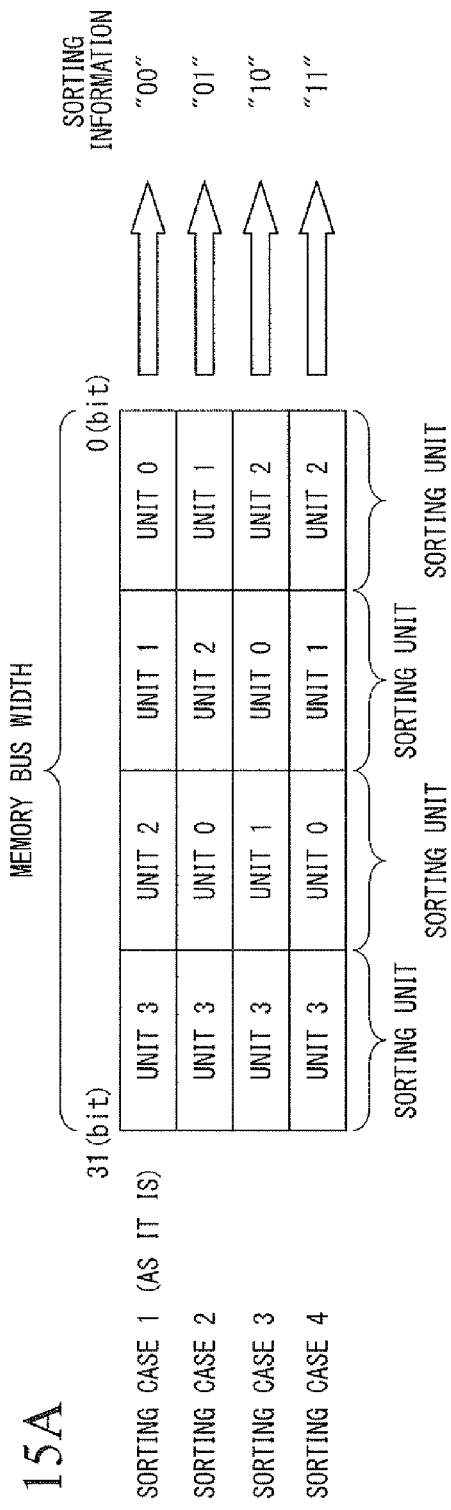
FIG. 15A is a diagram illustrating still another example of the data-arranging method in the packed data generation unit included in the data conversion unit of the second configuration.
Figure 15B:
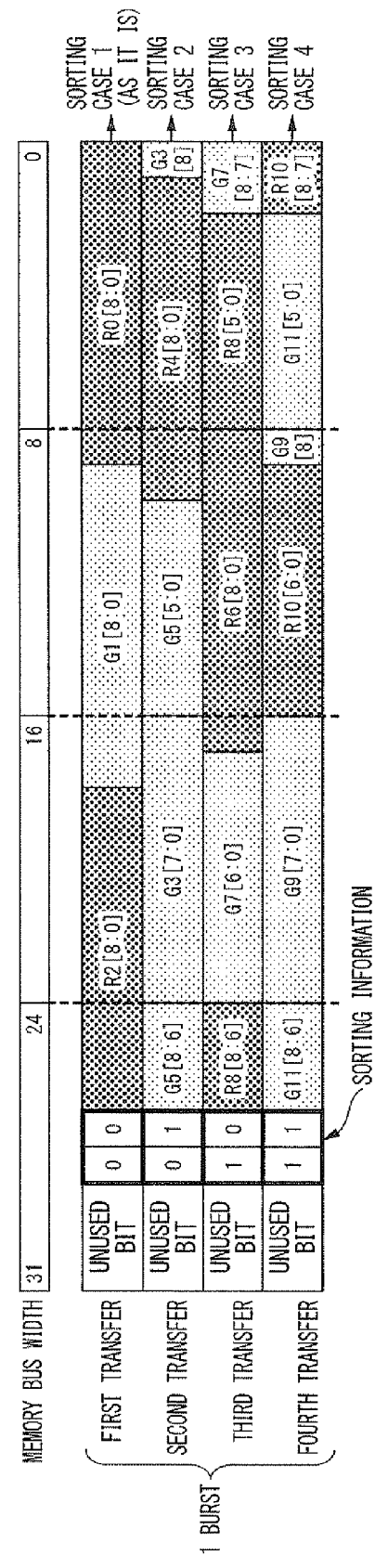
FIG. 15B is a diagram illustrating still another example of the data-arranging method in the packed data generation unit included in the data conversion unit of the second configuration.

FIGS. 15A and 15B are diagrams illustrating still another example (a ninth packing method) of the data-arranging method in the packed data generation unit 431 included in the data conversion unit 43 of the second configuration. FIG. 15A shows combinations of previously set arrangements (sorting cases) in the ninth packing method. FIG. 15B shows an arrangement of pixel data in packed data in which an arrangement of pixel data has been changed using the ninth packing method. A number subsequent to "Unit" in a table shown in FIG. 15A is information given to facilitate the explanation, for identifying a sorting unit (1-byte unit in FIG. 15A). This number is given in order from a lower sorting unit (1 byte) when sorting of the packed data is not performed (sorting case 1), and is information for identifying to a position of which sorting unit the pixel data has been changed through an arrangement-changing process.

In the ninth packing method, the packed data generation unit 431 first sequentially arranges data of respective bits of input pixel data, in respective bits of the memory bus to generate packed data having a bit number corresponding to a width of the memory bus, as in the sixth packing method. Also, the packed data generation unit 431 compares bits of the pixel data in the packed data between two continuous transfers in each prescribed sorting unit (1-byte unit), and sorts an arrangement of the pixel data in the packed data in a range of the prescribed combination of sorting cases to generate the packed data. Further, information when the arrangement of the pixel data in the packed data is sorted (sorting information shown in FIG. 15A) is added in unused bits in which the pixel data has not been arranged in packed data of each transfer, resulting in final packed data of one transfer.

Further, the same sorting case is determined in advance in the packed data generation unit 431 and the data-restoring unit 542. Accordingly, the data-restoring unit 542 may recognize the sorting case used when the packed data generation unit 431 sorts the arrangement of pixel data in packed data, by confirming the sorting information added to the packed data of each transfer. The data-restoring unit 542 may restore each packed pixel data to original pixel data by sorting the arrangement of the pixel data in the packed data to be an arrangement that is reverse to the sorting case employed in the packed data generation unit 431, that is, the arrangement of the original pixel data.

When final packed data shown in FIG. 15B is generated using the ninth packing method, the packed data generation unit 431 first packs respective pixel data ("R0," "G1," "R2," "G3," "R4," "G5," "R6," "G7," "R8," "G9," "R10" and "G11") in Bayer data to generate packed data (see FIG. 12).

Next, the packed data generation unit 431 divides the memory bus width for the packed data into sorting units of a prescribed bit number (in FIG. 15B, 8 bit: 1 byte). Also, for example, the packed data generation unit 431 compares a value of each bit of packed data of the first transfer with a value of each bit of packed data of the second transfer to calculate the number of bits whose values have been changed in each sorting unit. Also, the packed data generation unit 431 selects a sorting combination (sorting case) in which the calculated number of bits whose values have been changed becomes smallest. Also, the packed data generation unit 431 sorts the arrangement of the pixel data in the packed data of the second transfer to be the arrangement of the selected sorting case for each sorting unit to generate the packed data.

In the arrangement of the respective pixel data in the packed data shown in FIG. 15B, the packed data of the first transfer is used as the reference packed data. Accordingly, since sorting of the packed data of the first transfer is not performed, the sorting case 1 is selected. The packed data generation unit 431 adds (bit-couples) the value of sorting information corresponding to the selected sorting case 1 in unused bits of the packed data of the first transfer. The unused bits are bits "27" to "31" in FIG. 15B. In FIG. 15B, a case in which the sorting information value ("00") corresponding to the sorting case 1 is bit-coupled to bits "27" and "28" of the packed data of the first transfer is shown. The packed data generation unit 431 outputs the packed data of the first transfer with the sorting information added thereto as final packed data of the first transfer.

Further, a case in which the sorting case 2 is selected when the packed data of the first transfer is switched to the packed data of the second transfer in the arrangement of the respective pixel data in the packed data shown in FIG. 15B, a sorting case 3 is selected when the packed data of the second transfer is switched to the packed data of the third transfer, and a sorting case 4 is selected when the packed data of the third transfer is switched to the packed data of the fourth transfer is shown. In FIG. 15B, cases in which the following unused bits and values are bit-coupled are shown: a case in which a sorting information value ("01") corresponding to the sorting case 2 is bit-coupled to the unused bits of the packed data of the second transfer, a case in which a sorting information value ("10") corresponding to the sorting case 3 is bit-coupled to the unused bits of the packed data of the third transfer, and a case in which a sorting information value ("11") corresponding to the sorting case 4 is bit-coupled to unused bits of the packed data of the fourth transfer. The packed data generation unit 431 sequentially outputs the packed data of the second to fourth transfers having the sorting information added thereto as final packed data of the second to fourth transfers.

<Tenth Data-Arranging Method>

Figure 16:
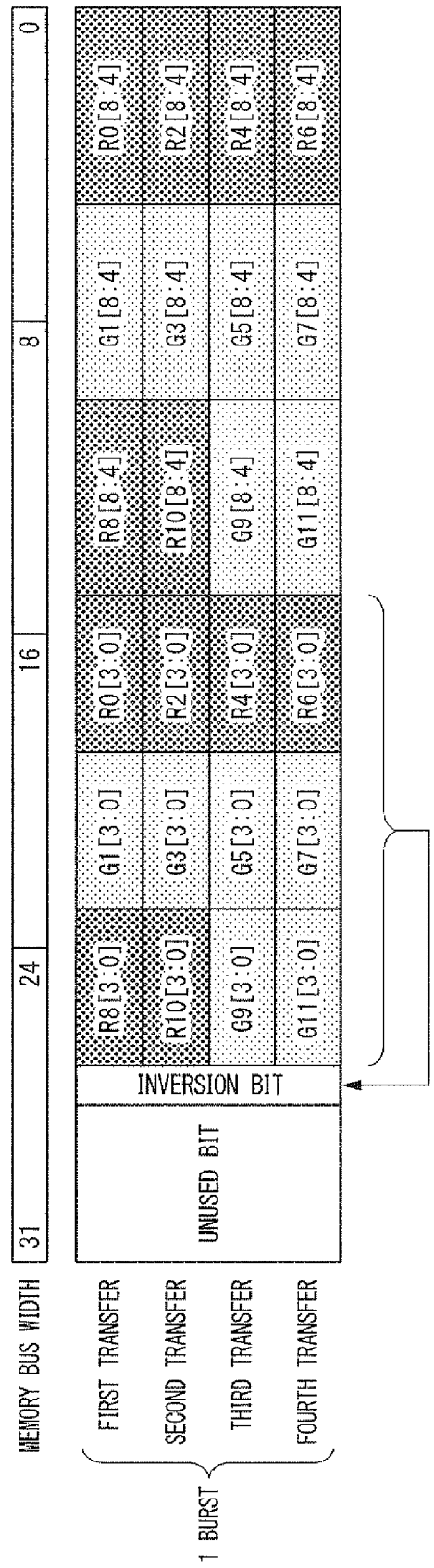
FIG. 16 is a diagram illustrating still another example of the data-arranging method in the packed data generation unit included in the data conversion unit of the second configuration.

FIG. 16 is a diagram illustrating still another example (a tenth packing method) of the data-arranging method in the packed data generation unit 431 included in the data conversion unit 43 of the second configuration. FIG. 16 shows an arrangement of pixel data in packed data in which pixel data inversion-processed using the tenth packing method is arranged. Since the inversion process in the tenth packing method is the same as the inversion process in the fifth packing method described with reference to FIGS. 8A and 8B, a detailed description thereof will be omitted.

In the tenth packing method, the packed data generation unit 431 first sequentially arranges data of respective bits of input pixel data in respective bits of the memory bus to generate packed data having a bit number corresponding to a width of the memory bus, as in the sixth packing method. The packed data generation unit 431 divides the respective pixel data arranged in packed data of one transfer into prescribed upper and lower bits, and collects and inversion-processes lower bits of the respective pixel data arranged in packed data of one transfer, as in the fifth packing method. The packed data generation unit 431 separately arranges the upper bits of the respective pixel data and the inversion-processed lower bits of the respective pixel data in the memory bus of one transfer. Also, the packed data generation unit 431 adds an inversion bit that is information when the lower bits of the pixel data is inversion-processed in an unused bit in the packed data of each transfer in which pixel data has not been arranged to generate final packed data of one transfer.

Further, the packed data generation unit 431 and the data-restoring unit 542 share content indicated by a value of the inversion bit, that is, information indicating that the inversion process has been performed. Arrangement positions of upper bits and lower bits of the pixel data separately arranged in the packed data of one transfer are also determined in advance. Accordingly, the data-restoring unit 542 can determine whether the packed data generation unit 431 has performed the inversion process by confirming the inversion bit. The data-restoring unit 542 can restore the lower bits of the pixel data to the original by inversion-processing the data inversion-processed by the packed data generation unit 43 (more specifically, the lower pixel data). Thereafter, each pixel data arranged in the packed data of one transfer can be restored to the original pixel data by coupling the upper bits of the pixel data and the lower bits of the pixel data restored to the original.

When the final packed data as shown in FIG. 16 is generated using the tenth packing method, the packed data generation unit 431 first packs respective pixel data ("R0," "G1," "R2," "G3," "R4," "G5," "R6," "G7," "R8," "G9," "R10" and "G11") in Bayer data to generate packed data. More specifically, the packed data generation unit 431 arranges (packs) "R0," "G1" and "R8" in the first transfer, "R2," "G3" and "R10" in the second transfer, "R4," "G5" and "G9" in the third transfer, and "R6," "G7" and "G11" in the fourth transfer, sequentially from the least significant bit of the memory bus.

Next, the packed data generation unit 431 collects and inversion-processes the lower bits of the pixel data arranged in the packed data of each transfer. For example, the packed data generation unit 431 collects and inversion-processes bit [0] to bit [3] of "R0," "G1" and "R8" in the packed data of the first transfer. The packed data generation unit 431 packs the upper bits of the pixel data arranged in the packed data of each transfer sequentially from the least significant bit of the packed data in each transfer. For example, the packed data generation unit 431 packs bit [4] to bit [8] of "R0," "G1" and "R8" in the packed data of the first transfer sequentially from the least significant bit of the packed data in each transfer. Also, the packed data generation unit 431 sequentially packs the inversion-processed lower bits of the pixel data, subsequent to the upper bits of the pixel data arranged in the packed data of each transfer. The packed data generation unit 431 bit-couples the inversion bit when the lower bits of the pixel data are inversion-processed, in an unused bit in the packed data in each transfer (in FIG. 16, bit [27] of the memory bus).

Figure 17:
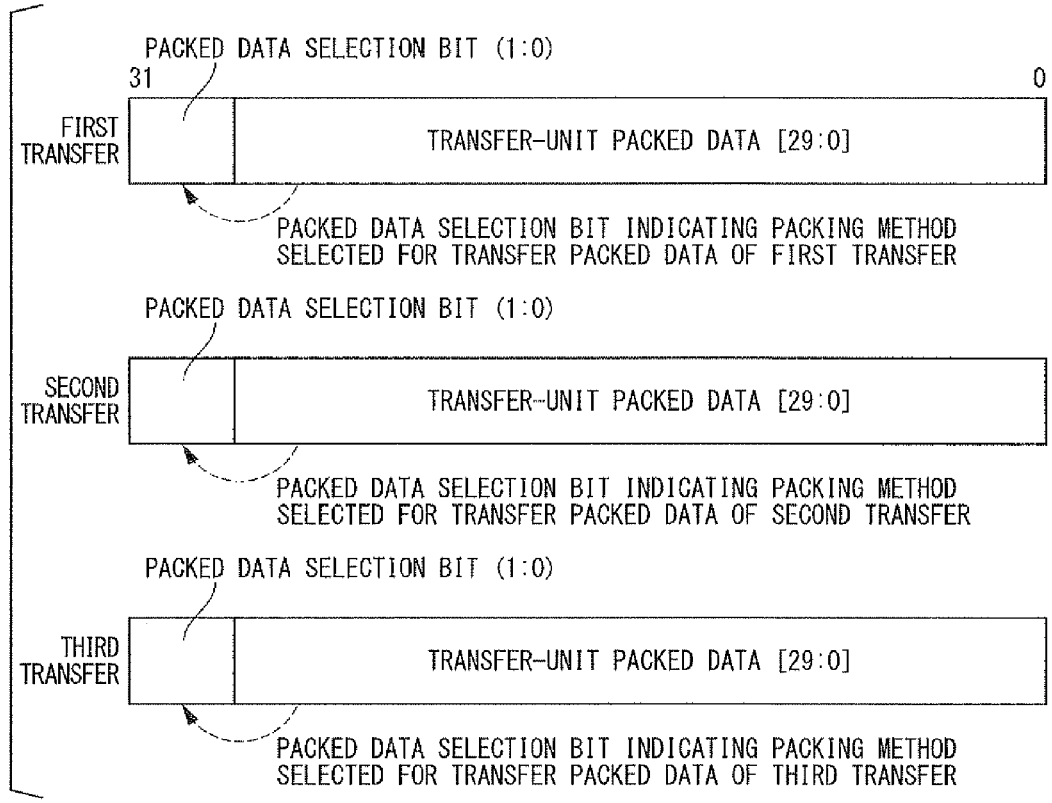
FIG. 17A is a diagram illustrating transfer data output from the data conversion unit of the second configuration.
FIG. 17B is a diagram illustrating transfer data output from the data conversion unit of the second configuration.

Next, the transfer data output by the data conversion unit 43 will be described. FIGS. 17A and 17B are diagrams illustrating the transfer data output from the data conversion unit 43 of the second configuration. As described above, the data conversion unit 43 sequentially outputs 32-bit transfer data obtained by arranging data of each bit of 9-bit pixel data sequentially input from the imaging-processing unit 40, in each bit on the memory bus, for example, based on a data enable signal, which is not shown, input from the output DMA unit 45.

The data conversion unit 43 includes the packed data generation units 431a to 431d for arranging (packing) a pixel data input in the data conversion unit 43 to generate packed data a to d using any one packing method of the sixth to tenth packing methods. The comparison unit 437 selects the packed data of which the change on the memory bus is smallest, as the transfer-unit packed data, and outputs the packed data selection bit indicating the packed data selected as the transfer-unit packed data. For example, As shown in FIG. 17A, the values of the packed data selection bits corresponding to the packed data selected as the transfer-unit packed data are determined in the comparison unit 437 in advance. Further, in the correspondence between the transfer-unit packed data and the packed data selection bit shown in FIG. 17A, the packed data selection bits corresponding to the four packed data generation units 431 are set in advance, and accordingly, a bit number of the packed data selection bit is 2.

The bit-coupling unit 439 adds, for example, the packed data selection bit in a prescribed fixed position in the transfer-unit packed data of one transfer to generate the transfer-unit packed data as shown in FIG. 17B, and outputs the transfer-unit packed data to the output DMA unit 45 as transfer data of one transfer finally output by the data conversion unit 43 in each transfer. In FIG. 17B, a case in which the fixed position in which the packed data selection bit is added has been determined as 2 bits from the most significant bit of the packed data of each transfer (more specifically, bits [31] and [30] of the memory bus) in advance is shown. In FIG. 17B, transfer data of three transfers is also shown.

The data conversion unit 43 and the data inverse-conversion unit 54 share information of the fixed position in which the packed data selection bit is added. Further, the data conversion unit 43 and the data inverse-conversion unit 54 share the correspondence between the selected packed data and the values of the packed data selection bit as shown in FIG. 17A, that is, information of the method of packing the transfer data of each transfer share indicated by the values of the packed data selection bit. Accordingly, the data inverse-conversion unit 54 can determine the packing method applied to the transfer data of each transfer output from the data conversion unit 43 by confirming the packed data selection bit. The data inverse-conversion unit 54 can select, as original pixel data, the unpacked data of one transfer obtained by sequentially dividing (unpacking) the data arranged in each bit of the transfer-unit packed data using a method that is reverse to the packing method applied to the transfer data of one transfer. Through repetition of such restoration of the original pixel data of each transfer, original pixel data of one burst, that is, the packing unit (four transfers), is restored.

Further, in the data conversion unit 43 of the second configuration, the first transfer data (the transfer data of the first transfer) (e.g., the transfer data of the first transfer shown in FIG. 17B) in the transfer data of one burst (four transfers) is reference transfer data. Accordingly, the transfer data of the first transfer is not subjected to the process of sorting the arranged pixel data or the packing process such as the inversion process. Accordingly, the packed data selection bit added to the transfer data of the first transfer has a value indicating that the process of sorting the pixel data or the packing process such as the inversion process has not been performed. Thereafter, the value of the packed data selection bit indicating that the packed data is packed data obtained by packing using the selected packing method is added to the transfer data of the second transfer and the subsequent transfers.

Further, the data conversion unit 43 and the data inverse-conversion unit 54 may set a reference process (a packing process) in advance. In this case, the value of the packed data selection bit indicating the previously set reference packing process is added to the packed data selection bit added to the transfer data of the first transfer.

As described above, the data conversion unit 43 of the second configuration can select and output packed data of which the change amount of each bit of the memory bus is smallest in burst transfer from among the packed data of each transfer generated using the plurality of packing methods. Also, the data conversion unit 43 outputs the packed data selection bit indicating the selected packed data (packing method) together with the transfer data in each transfer. Accordingly, as the data conversion unit 43 of the second configuration selects a packing method optimal to pixel data to be transferred in each transfer, it is possible to realize data transfer having a higher effect of reduction of power consumption due to the image data transfer than the data conversion unit 41 of the first configuration. Accordingly, it is possible to further reduce power consumption due to pixel data transfer between each component (processing block) and the memory 20 in the imaging apparatus 1, that is, pixel data delivery between components in the imaging apparatus 1.

As described above, according to the embodiments of the present invention, the packing method optimal to the pixel data to be transferred is selected, and the transfer data packed using the optimal packing method is output. Further, the information indicating the selected optimal packing method is added in the unused bits of the transfer data and output. Accordingly, it is possible to decrease a change amount of the bits of the memory bus between two continuous transfers in the burst transfer, and to easily restore the original pixel data from the transfer data. Moreover, it is possible to maintain data transfer efficiency to be the same as existing data transfer efficiency. Accordingly, it is possible to sufficiently obtain the effect of reduction of power consumption due to data delivery between each component (processing block) and the memory in the imaging apparatus.

Although the case in which one burst (four transfers) or one transfer is a selection unit for an optimal packing method, and the packed data selection bit indicating that the selected packing method is added has been described in the embodiment described above, the selection unit for the optimal packing method is not limited to the present embodiment. For example, the respective pixel data may be the selection unit for the optimal packing method.

Figure 18:
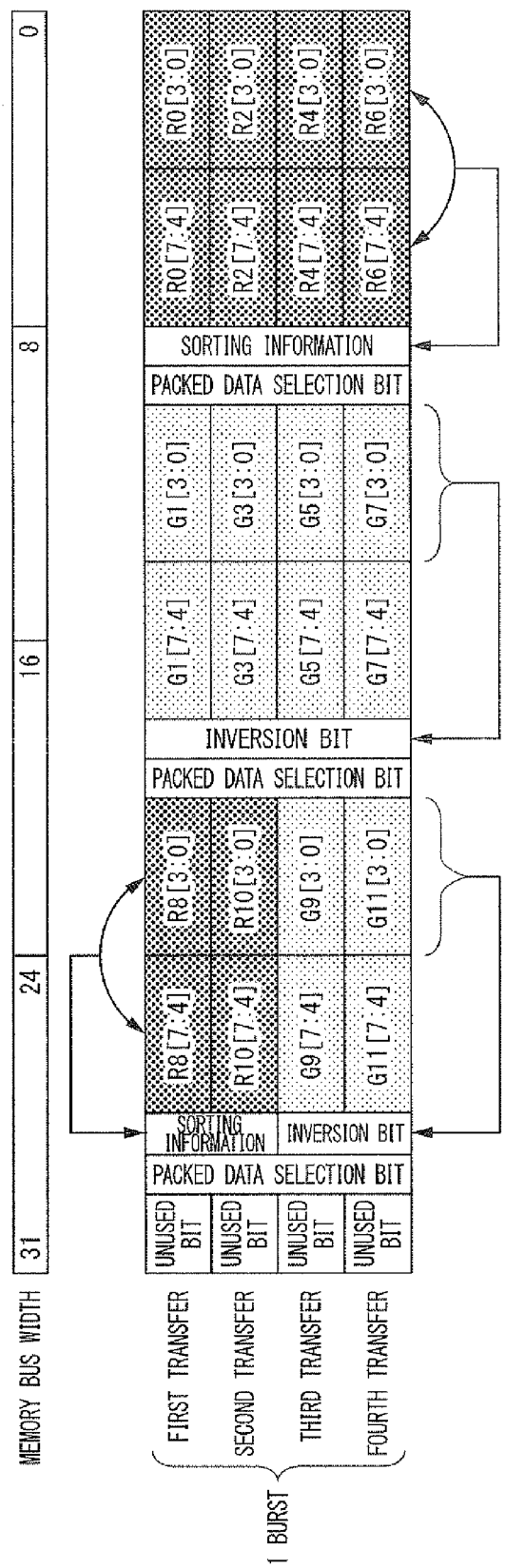
FIG. 18 is a diagram illustrating an example of a case in which a process in the data conversion unit of the present embodiment is applied to each data.
Figure 19:
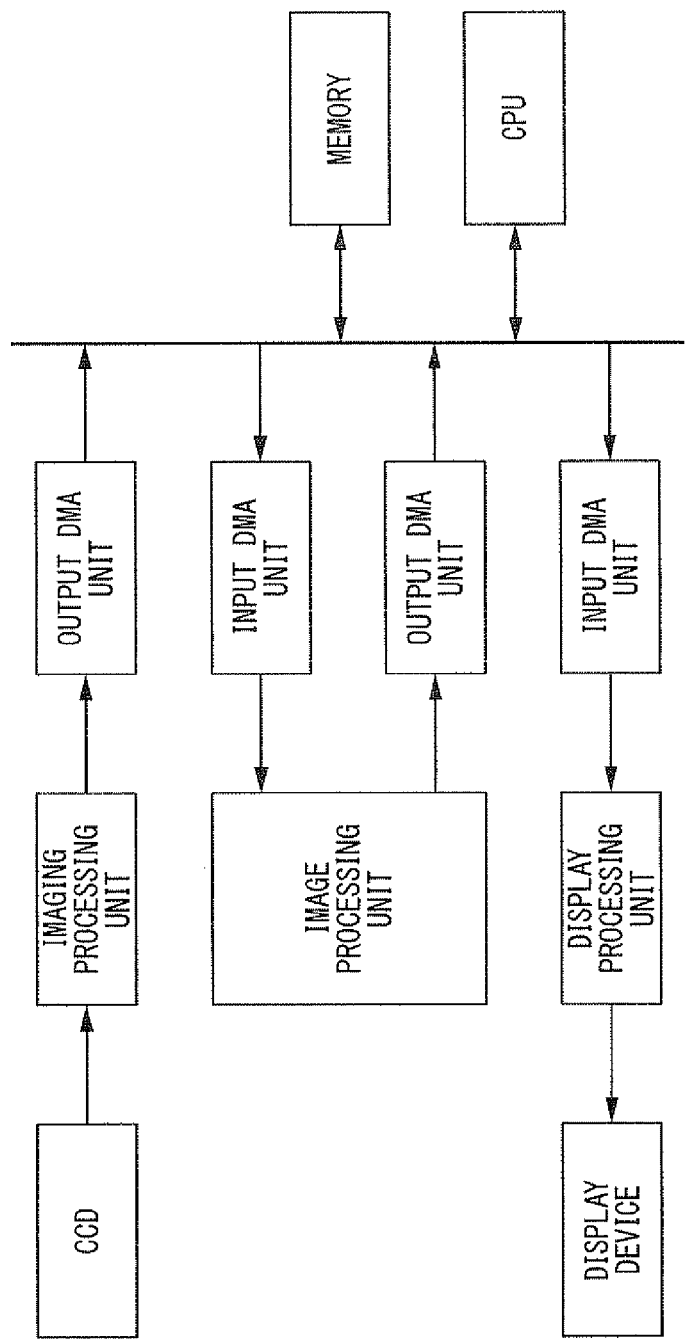
FIG. 19 is a block diagram showing a schematic configuration of a conventional imaging apparatus.
Figure 22A:
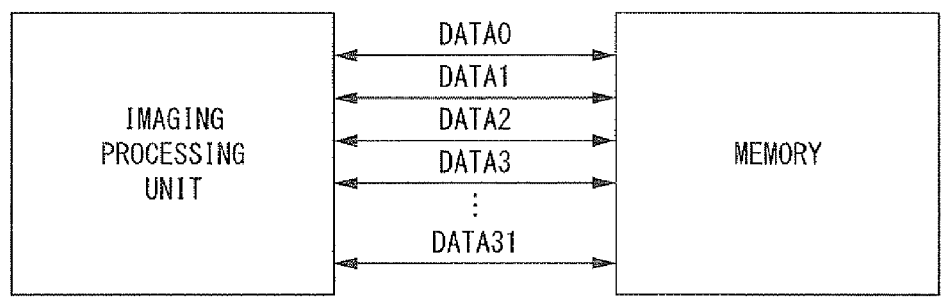
FIG. 22A is a diagram illustrating a relationship between data change on a data bus and power consumption.
Figure 22B:
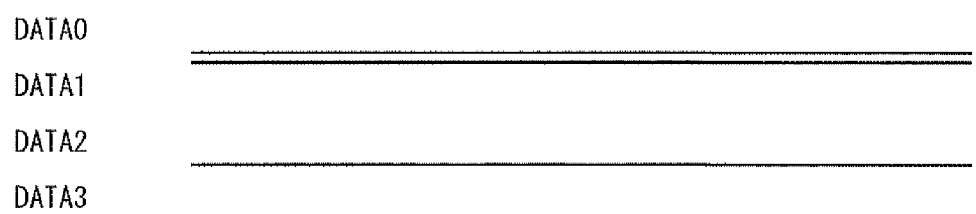
FIG. 22B is a diagram illustrating the relationship between the data change on the data bus and the power consumption.
Figure 22C:
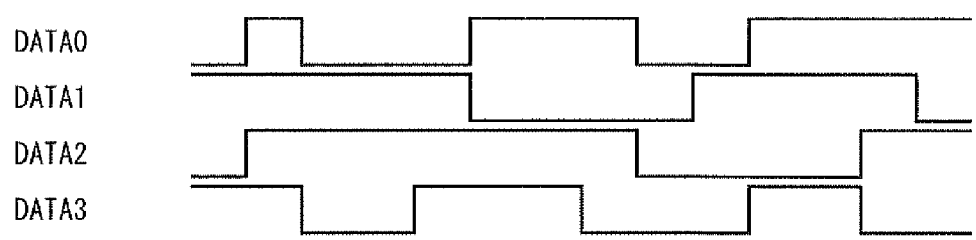
FIG. 22C is a diagram illustrating the relationship between the data change on the data bus and the power consumption.
Figure 22D:
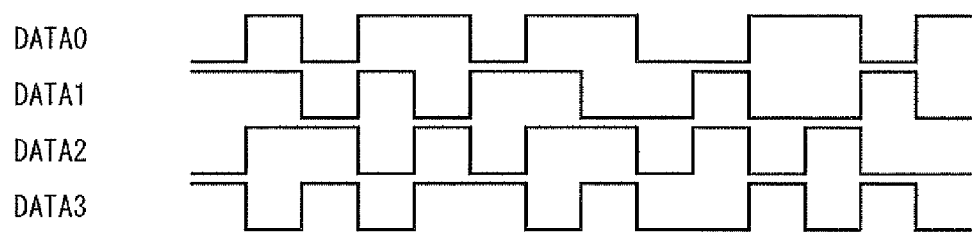
FIG. 22D is a diagram illustrating the relationship between the data change on the data bus and the power consumption.
Figure 23A:
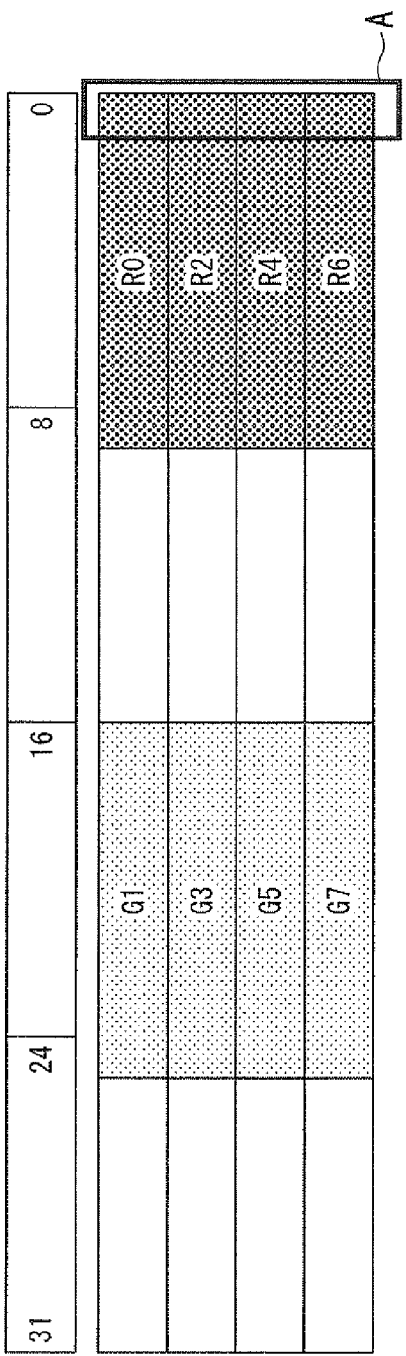
FIG. 23A is a diagram showing an example of a state of a data arrangement in a conventional data-packing method.
Figure 23B:
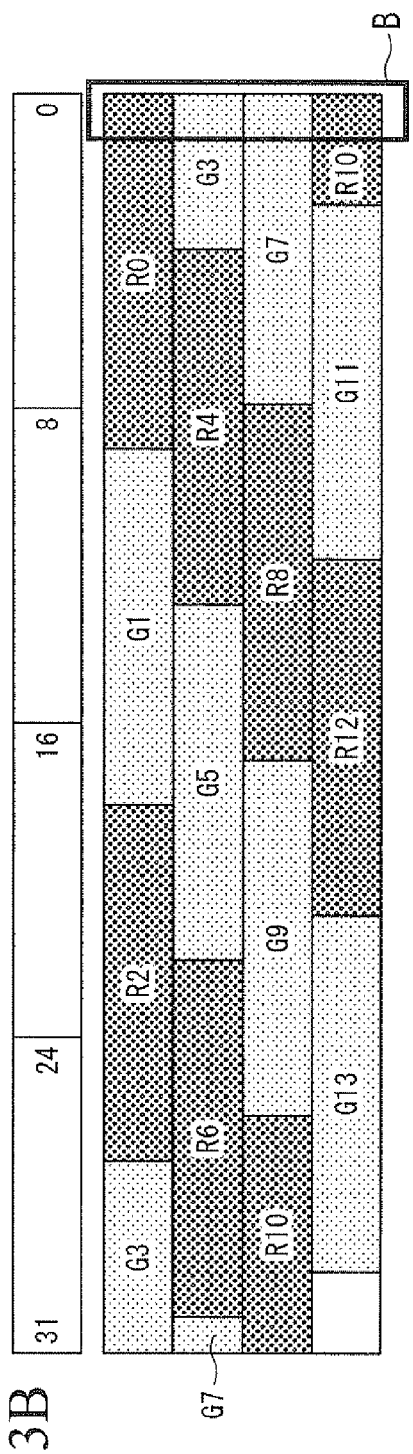
FIG. 23B is a diagram showing an example of the state of the data arrangement in the conventional data-packing method.
Figure 24:
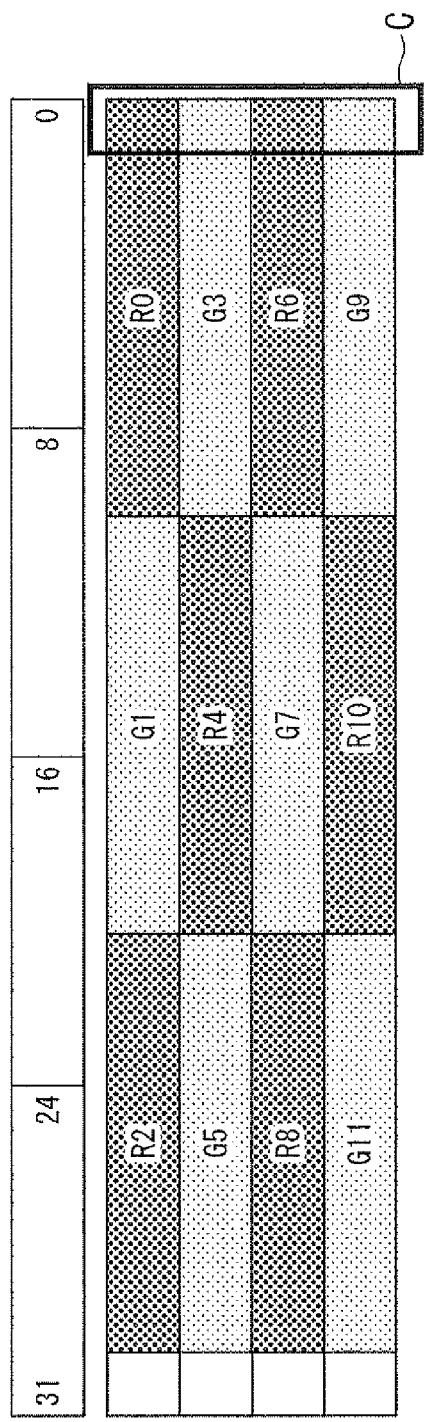
FIG. 24 is a diagram showing another example of the state of the data arrangement in a conventional data-packing method.

An example of this case will be described. FIG. 18 is a diagram illustrating an example of a case in which the packing process in the data conversion unit of the present embodiment is applied to each data (pixel data). Further, hereinafter, in order to facilitate explanation, a case in which respective pixel data in the Bayer data shown in FIG. 20 is sequentially input and packed using each pixel data as one packing unit will be described. Further, it is assumed that a bit number of each pixel data in the Bayer data is 8, and a width of the memory bus is 32 bits. It is also assumed that pixel data of three pixels in one transfer is packed.

In FIG. 18, a case in which a different packing process is applied to each pixel data arranged in each packed data is shown. More specifically, a case in which a sorting process of sorting and arranging the upper bits and lower bits of the pixel data is applied to "R" pixels in each packed data, and sorting information indicating that sorting has been performed is added in an upper bit of the "R" pixel data is shown. Also, a case in which an inversion process is applied to lower bits of the pixel data of "G" pixels in each packed data and an inversion bit indicating the inversion process has been performed is added to upper bits of the "G" pixel is shown. Also, a case in which a packed data selection bit is added in another upper bit of each pixel data to indicate which process (packing process) among the sorting process and the inversion process has been performed on each pixel data is shown.

The data conversion unit and the data inverse-conversion unit share information of the fixed position in which the packed data selection bit is added. In FIG. 18, the data conversion unit and the data inverse-conversion unit share information of bits [9], and [29] of the memory bus. Further, the data conversion unit and the data inverse-conversion unit share the value of the packed data selection bit indicating which process of the sorting process and the inversion process has been performed. Accordingly, the data inverse-conversion unit can determine the packing process applied to each pixel data among the packed data output from the data conversion unit by confirming the packed data selection bit. Also, the data inverse-conversion unit can restore each pixel data arranged in each packed data to original pixel data using a method that is reverse to the packing process applied to each pixel data. Through repetition of such restoration to original pixel data of each pixel data, original pixel data of one burst, that is, the packing unit (four transfers), is restored.

Further, in FIG. 18, the 1-bit packed data selection bit is used to indicate which process of the sorting process and the inversion process has been performed. Even in this state, it can indicate that neither the sorting process nor the inversion process is performed. For example, pixel data not subjected to the sorting process, that is, not subjected to any process, can be packed by determining the value of the packed data selection bit as a value indicating the sorting process in advance and setting the sorting information as a value indicating that sorting is not performed. Also, for example, conversely, pixel data not subjected to the inversion process, that is, not subjected to any process, may be packed by determining the value of the packed data selection bit to a value indicating the inversion process in advance and setting the inversion bit to a value indicating that the inversion process is not performed.

While the case in which the packing methods of the present embodiments have been applied to the Bayer data has been described in the embodiment described above, the packing method of the present embodiment is not limited to the application to the Bayer data and may be applied to various image data, such as RGB data, YCbCr data having YC422 or YC444 dot sequential format, and OSD data. Further, the packing method of the present embodiment is not limited to the application to the image data and may be applied to data having other formats, such as audio data.

While the case in which four transfers constitute a burst transfer unit and one burst is a data-packing unit has been described in the present embodiment, the number of transfers in one burst transfer and the data-packing unit are not limited to the present embodiment. For example, 64 transfers may constitute the burst transfer unit and 16 transfers in one burst may be the data-packing unit, that is, four packing units may be included in one burst. Alternatively, for example, 16 transfers may constitute the data-packing unit and 8 transfers may constitute the burst transfer unit, that is, the packing unit may include two burst transfers.

Further, while the packing method when data delivery is performed among the components in the imaging apparatus has been described using some examples in the present embodiment, a packing method for packing data is not limited to the present embodiment. Further, a range in which data delivery by the configuration of the data conversion unit and the data inverse-conversion unit of the present embodiment may be applied is not limited to the present embodiment and it may be applied to any system in which data delivery is performed between components.

Further, while the example in which the data conversion unit is arranged as a preceding processing block of the output DMA unit and the data inverse-conversion unit is arranged as a subsequent processing block of the input DMA unit has been described in the present embodiment, the arrangements of the data conversion unit and the data inverse-conversion unit are not limited to the present embodiment. For example, the data conversion unit may be a component of the output DMA unit and the data inverse-conversion unit may be a component of the input DMA unit. Furthermore, for example, the data conversion unit may be a component of a preceding imaging-processing unit and the data inverse-conversion unit may be a component of a subsequent image-processing unit.

While the embodiments of the present invention have been described above with reference to the drawings, a concrete configuration is not limited to the embodiments and various variations without departing from the scope and spirit of the present invention fall within the present invention. The present invention is not limited to the above description but limited only by the accompanying claims.

What is claimed is:

1. A data-processing device comprising:
a data conversion unit for, when converting a plurality of sequentially input data into transfer data of the same bit number as a data bus having a prescribed bit number and sequentially transferring the transfer data, arranging the input data in each transfer data in a conversion unit using one transfer data as one transfer unit and a prescribed number of transfer units as one conversion unit,
wherein the data conversion unit comprises:
a plurality of data generation units configured to arrange the input data in the data bus to generate first conversion data based on each prescribed arranging method;
a plurality of bit change number calculation units corresponding to the plurality of data generation units, respectively, the bit change number calculation units configured to compare a value of each bit in the first conversion data output at the n-th time (n is a natural number equal to or more than 1) by the data generation unit with a value of each bit in the first conversion data output at the (n+1)-th time by the data generation unit, and configured to calculate a bit number based on the comparison result as a bit change number, for each first conversion data;
a bit change number comparison unit configured to compare values of the respective bit change numbers corresponding to the respective data generation units, configured to select the data generation unit having generated the first conversion data based on the comparison result, and configured to output selection information indicating the selected data generation unit;
a first data selection unit configured to select any one of the respective first conversion data output from the respective data generation units based on the selection information, and configured to output the first selected conversion data as selection data; and
a bit-coupling unit configured, when the selection data is output as the transfer data, to couple the selection information in a position of a prescribed unused bit in the selection data in which the input data has not been arranged and outputting the selection information.

2. The data-processing device according to claim 1, wherein:
the bit change number comparison unit is configured to select the data generation unit having generated the first conversion data of which the value of the bit change number is smallest as a result of comparing values of the respective bit change numbers corresponding to the respective data generation units.

3. The data-processing device according to claim 2, wherein:
each of the bit change number calculation units is configured to calculate the bit change number using the selection data selected by the first data selection unit as the first conversion data output at the (n+1)-th time by the respective data generation unit.

4. The data-processing device according to claim 1, wherein:
the bit change number comparison unit is configured to collect and compare values of the respective bit change numbers corresponding to the respective data generation units, in each conversion unit, and is configured to select the data generation unit having generated the first conversion data in the conversion unit based on the comparison result,
the first data selection unit is configured to select any one of the respective first conversion data of the conversion unit output from the respective data generation units based on the selection information, and is configured to output the selected first conversion data of the conversion unit as selection data of the conversion unit, and
when the selection data of the conversion unit is output as transfer data of the conversion unit, the bit-coupling unit is configured to couple the selection information in a position of a prescribed unused bit of the first conversion data containing unused bits in which the input data has not been arranged among the first conversion data contained in the selection data of the conversion unit to generate coupled data, and sequentially outputs any one of the first conversion data contained in the selection data of the conversion unit and the coupled data in each transfer unit.

5. The data-processing device according to claim 4, wherein:
the bit change number comparison unit is configured to select the data generation unit having generated the first conversion data in the conversion unit in which a collected value of the bit change number is smallest in all the first conversion data contained in the conversion unit as a result of collecting and is configured to compare values of the respective bit change numbers corresponding to the respective data generation units, in each conversion unit.

6. A data-processing device comprising:
a data inverse-conversion unit for configured to convert a plurality of input data into transfer data having the same bit number as a data bus having a prescribed bit number, and configured to sequentially inversely convert transfer data sequentially transferred in each conversion unit using one transfer data as one transfer unit and a prescribed number of transfer units as one conversion unit to restore a plurality of original input data,
wherein the data inverse-conversion unit includes:
a bit division unit configured to generate respective first conversion data in which a data-processing device of a transfer source for the transfer data arranges the input data as the transfer data in the data bus based on respective prescribed arranging methods, configured to compare a value of each bit in the first conversion data generated at the n-th time (n is a natural number equal to or more than 1) with a value of each bit in the first conversion data output at the (n+1)-th time, configured to calculate, for each first conversion data, a bit change number that is a bit number based on the comparison result, receiving, from the data bus, any one first conversion data selected from among the respective first generated conversion data based on a result of comparing values of the respective calculated bit change numbers, and selection information indicating that any first conversion data has been selected, as transfer data from the data-processing device of the transfer source for the transfer data, and configured to divide the input transfer data into the selection information coupled in a position of a prescribed bit in the transfer data and the first conversion data;

a plurality of data-restoring units configured to generate second conversion data so that a plurality of input data arranged in the first conversion data is restored to the original input data based on respective prescribed restoring methods corresponding to the respective prescribed arranging methods when the data-processing device of the transfer source for the transfer data generates the first conversion data; and a second data selection unit configured to select any one of the respective second conversion data output from the respective data-restoring units based on the selection information, and outputting the selected second conversion data as the original input data.

7. The data-processing device according to claim 6, wherein:

the bit division unit is configured to collect the input transfer data for each conversion unit, and divide the selection information coupled in a position of a prescribed bit in any of the transfer data of the conversion unit, and the second data selection unit is configured to select any one of the respective second conversion data of the conversion unit output from the respective data-restoring units based on the selection information, and sequentially output the second selected conversion data of the conversion unit as the original input data.

8. A data-processing method comprising:

a data conversion step of, when converting a plurality of sequentially input data into transfer data of the same bit number as a data bus having a prescribed bit number and sequentially transferring the transfer data, arranging the input data in each transfer data in a conversion unit using one transfer data as one transfer unit and a prescribed number of transfer units as one conversion unit, wherein the data conversion step comprises:

a plurality of data generation steps of arranging the input data in the data bus to generate first conversion data based on each prescribed arranging method;

a plurality of bit change number calculation steps corresponding to the plurality of data generation steps, respectively, the bit change number calculation steps including comparing a value of each bit in the first conversion data output at the n-th time (n is a natural number equal to or more than 1) in the data generation step with a value of each bit in the first conversion data output at the (n+1)-th time in the data generation step, and calculating a bit number based on the comparison result as a bit change number, for each first conversion data;

a bit change number comparison step of comparing values of the respective bit change numbers corresponding to the respective data generation step, selecting the data generation step in which the first conversion data has been generated based on the comparison result, and outputting selection information indicating the selected data generation step;

a first data selection step of selecting any one of the respective first conversion data output in the respective data generation steps based on the selection information, and outputting the first selected conversion data as selection data; and a bit-coupling step of, when the selection data is output as the transfer data, coupling the selection information in a position of a prescribed unused bit in the selection data in which the input data has not been arranged and outputting the selection information.

9. A data-processing method comprising:

a data inverse-conversion step of converting a plurality of input data into transfer data having the same bit number as a data bus having a prescribed bit number, and sequentially inversely converting transfer data sequentially transferred in each conversion unit using one transfer data as one transfer unit and a prescribed number of transfer units as one conversion unit to restore a plurality of original input data, wherein the data inverse-conversion step comprises:

a bit division step of generating respective first conversion data in which a data-processing device of a transfer source for the transfer data arranges the input data as the transfer data in the data bus based on respective prescribed arranging methods, comparing a value of each bit in the first conversion data generated at the n-th time (n is a natural number equal to or more than 1) with a value of each bit in the first conversion data output at the (n+1)-th time, calculating, for each first conversion data, a bit change number that is a bit number based on the comparison result, receiving, from the data bus, any one first conversion data selected from among the respective first generated conversion data based on a result of comparing values of the respective calculated bit change numbers, and selection information indicating that any first conversion data has been selected, as transfer data from the data-processing device of the transfer source for the transfer data, and dividing the input transfer data into the selection information coupled in a position of a prescribed bit in the transfer data and the first conversion data;

a plurality of data-restoring steps of generating second conversion data so that a plurality of input data arranged in the first conversion data is restored to the original input data based on respective prescribed restoring methods corresponding to the respective prescribed arranging methods when the data-processing device of the transfer source for the transfer data generates the first conversion data; and a second data selection step of selecting any one of the respective second conversion data output in the respective data-restoring steps based on the selection information, and outputting the selected second conversion data as the original input data.

* * * * *